United States Patent
Yamazaki et al.

(10) Patent No.: US 7,948,169 B2
(45) Date of Patent: May 24, 2011

(54) LIGHT EMITTING ELEMENT WITH COMPOSITE LAYERS OF VARYING CONCENTRATION, LIGHT EMITTING DEVICE, AND ELECTRONIC APPARATUS

(75) Inventors: Shunpei Yamazaki, Setagaya (JP); Junichiro Sakata, Atsugi (JP); Ryoji Nomura, Yamato (JP)

(73) Assignee: Semiconductor Energy Larboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/823,675

(22) Filed: Jun. 25, 2010

(65) Prior Publication Data
US 2010/0258792 A1 Oct. 14, 2010

Related U.S. Application Data

(62) Division of application No. 11/473,332, filed on Jun. 23, 2006, now Pat. No. 7,745,989.

(30) Foreign Application Priority Data

Jun. 30, 2005 (JP) ................................ 2005-191401

(51) Int. Cl.
*H01J 1/62* (2006.01)
*H01J 63/04* (2006.01)
(52) U.S. Cl. ............ 313/504; 445/24; 445/25; 313/500; 313/502; 313/507; 313/512; 438/479
(58) Field of Classification Search .................. 428/690; 313/501–512; 445/24–25
See application file for complete search history.

(56) References Cited

U.S. PATENT DOCUMENTS

| 5,404,075 | A | 4/1995 | Fujikawa et al. |
| 5,773,929 | A | 6/1998 | Shi et al. |
| 5,783,292 | A | 7/1998 | Tokito et al. |
| 5,925,980 | A | 7/1999 | So et al. |

(Continued)

FOREIGN PATENT DOCUMENTS

EP 0 855 848 7/1998

(Continued)

OTHER PUBLICATIONS

Tokito et al., "Metal Oxides as a Hole-Injecting Layer for an Organic Electroluminescent Device," Journal of Physics D: Applied Physics, vol. 29, 1996, pp. 2750-2753.

(Continued)

*Primary Examiner* — Nimeshkumar D Patel
*Assistant Examiner* — Tracie Green
(74) *Attorney, Agent, or Firm* — Eric J. Robinson; Robinson Intellectual Property Law Office, P.C.

(57) ABSTRACT

It is an object of the present invention to provide a light emitting element with a low driving voltage. In a light emitting element, a first electrode; and a first composite layer, a second composite layer, a light emitting layer, an electron transporting layer, an electron injecting layer, and a second electrode, which are stacked over the first electrode, are included. The first composite layer and the second composite layer each include metal oxide and an organic compound. A concentration of metal oxide in the first composite layer is higher than a concentration of metal oxide in the second composite layer, whereby a light emitting element with a low driving voltage can be obtained. Further, the composite layer is not limited to a two-layer structure. A multi-layer structure can be employed. However, a concentration of metal oxide in the composite layer is gradually higher from the light emitting layer to first electrode side.

25 Claims, 14 Drawing Sheets

U.S. PATENT DOCUMENTS

| | | | |
|---|---|---|---|
| 5,989,737 A | 11/1999 | Xie et al. |
| 6,013,384 A | 1/2000 | Kido et al. |
| 6,380,687 B1 | 4/2002 | Yamazaki |
| 6,392,339 B1 | 5/2002 | Aziz et al. |
| 6,423,429 B2 | 7/2002 | Kido et al. |
| 6,483,236 B1 | 11/2002 | Hung |
| 6,486,601 B1 | 11/2002 | Sakai et al. |
| 6,489,638 B2 | 12/2002 | Seo et al. |
| 6,518,700 B1 | 2/2003 | Friend et al. |
| 6,552,496 B2 | 4/2003 | Yamazaki |
| 6,589,673 B1 | 7/2003 | Kido et al. |
| 6,593,691 B2 | 7/2003 | Nishi et al. |
| 6,608,449 B2 | 8/2003 | Fukunaga |
| 6,642,544 B1 | 11/2003 | Hamada et al. |
| 6,690,033 B2 | 2/2004 | Yamazaki et al. |
| 6,692,845 B2 | 2/2004 | Maruyama et al. |
| 6,774,573 B2 | 8/2004 | Yamazaki |
| 6,794,278 B2 | 9/2004 | Kido et al. |
| 6,830,494 B1 | 12/2004 | Yamazaki et al. |
| 7,074,500 B2 | 7/2006 | Pfeiffer et al. |
| 7,138,763 B2 | 11/2006 | Liao et al. |
| 7,141,817 B2 | 11/2006 | Nishi et al. |
| 7,158,161 B2 | 1/2007 | Gyoutoku et al. |
| 7,256,422 B2 | 8/2007 | Yamazaki |
| 7,491,590 B2 | 2/2009 | Maekawa |
| 7,605,534 B2 | 10/2009 | Yamazaki et al. |
| 7,700,958 B2 | 4/2010 | Nishi et al. |
| 7,732,808 B2 | 6/2010 | Ikeda et al. |
| 2001/0053559 A1 | 12/2001 | Nagao et al. |
| 2003/0189401 A1 | 10/2003 | Kido et al. |
| 2005/0035708 A1 | 2/2005 | Yamazaki et al. |
| 2005/0084712 A1 | 4/2005 | Kido et al. |
| 2005/0084713 A1 | 4/2005 | Kido et al. |
| 2005/0098207 A1 | 5/2005 | Matsumoto et al. |
| 2005/0214556 A1 | 9/2005 | Nishimi et al. |
| 2006/0008740 A1 | 1/2006 | Kido et al. |
| 2006/0138656 A1 | 6/2006 | Stegamat et al. |
| 2007/0131976 A1 | 6/2007 | Kanno et al. |
| 2007/0182317 A1 | 8/2007 | Kido et al. |

FOREIGN PATENT DOCUMENTS

| | | |
|---|---|---|
| EP | 0 948 063 | 10/1999 |
| EP | 1 009 198 | 6/2000 |
| EP | 1 065 723 | 1/2001 |
| EP | 1 089 361 | 4/2001 |
| EP | 1 093 167 | 4/2001 |
| EP | 1 160 891 | 12/2001 |
| EP | 1 261 042 | 11/2002 |
| EP | 1 351 558 | 10/2003 |
| EP | 1 261 042 | 9/2004 |
| EP | 1 524 706 | 4/2005 |
| EP | 1 524 707 | 4/2005 |
| EP | 1 530 245 | 5/2005 |
| EP | 1 351 558 | 7/2006 |
| JP | 01-312873 | 12/1989 |
| JP | 02-139892 | 5/1990 |
| JP | 03-114197 | 5/1991 |
| JP | 03-190088 | 8/1991 |
| JP | 03-274695 | 12/1991 |
| JP | 04-357694 | 12/1992 |
| JP | 05-182766 | 7/1993 |
| JP | 06-267658 | 9/1994 |
| JP | 06-290873 | 10/1994 |
| JP | 07-312289 | 11/1995 |
| JP | 09-063771 | 3/1997 |
| JP | 10-255985 | 9/1998 |
| JP | 10-270171 | 10/1998 |
| JP | 10-308284 | 11/1998 |
| JP | 11-251067 | 9/1999 |
| JP | 11-297474 | 10/1999 |
| JP | 11-307259 | 11/1999 |
| JP | 11-307264 | 11/1999 |
| JP | 2000-223276 | 8/2000 |
| JP | 2000-315580 | 11/2000 |
| JP | 2000-315581 | 11/2000 |
| JP | 2001-076868 | 3/2001 |
| JP | 2001-185354 | 7/2001 |
| JP | 2001-244079 | 9/2001 |
| JP | 2002-015873 | 1/2002 |
| JP | 2002-332567 | 11/2002 |
| JP | 2002-367784 | 12/2002 |
| JP | 2003-229278 | 8/2003 |
| JP | 2003-272860 | 9/2003 |
| JP | 2004-134395 | 4/2004 |
| JP | 2004-514257 | 5/2004 |
| JP | 2004-349007 | 12/2004 |
| JP | 2005-026121 | 1/2005 |
| JP | 2005-032618 | 2/2005 |
| JP | 2005-123094 | 5/2005 |
| JP | 2005-123095 | 5/2005 |
| JP | 2005-166637 | 6/2005 |
| WO | WO 00/01203 | 1/2000 |
| WO | WO 02/41414 | 5/2002 |
| WO | WO 2005/006460 | 1/2005 |

OTHER PUBLICATIONS

Nakada et al., "Multi Photon Emission Organic EL Devices Using Charge-Transfer Complex as Charge Generation Layer," The 63$^{rd}$ Autumn Meeting, 2002, vol. 27a-ZL-12, pp. 1165.

800

801

800

803
802
800

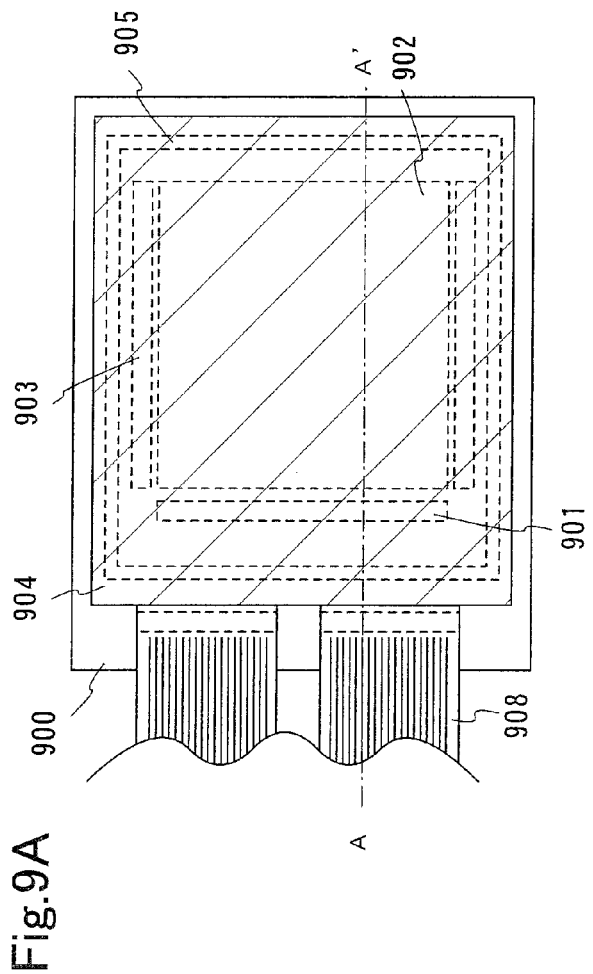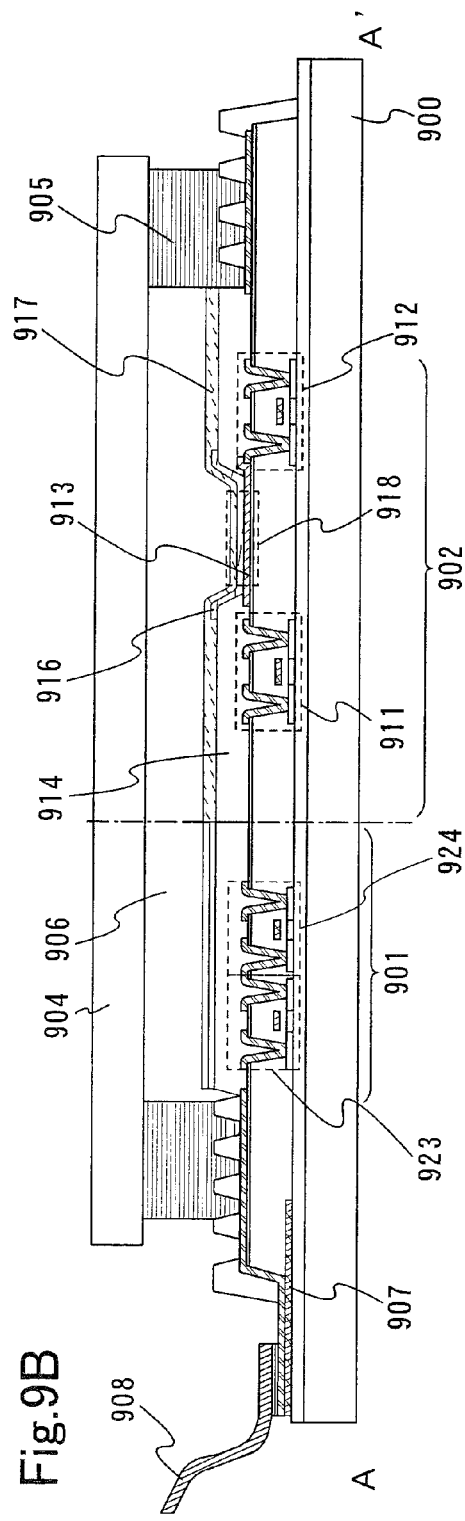

LIGHT EMITTING ELEMENT WITH COMPOSITE LAYERS OF VARYING CONCENTRATION, LIGHT EMITTING DEVICE, AND ELECTRONIC APPARATUS

BACKGROUND OF THE INVENTION

1. Field of the Invention

The present invention relates to a light emitting element having a layer including an organic compound between a pair of electrodes and a light emitting device using the light emitting element.

2. Description of the Related Art

In recent years, a light emitting device including an electroluminescence element as a self-light emitting element has been researched and developed. In particular, a light emitting device, which utilizes a so-called an organic electroluminescence element where a layer including an organic compound that emits light by applying an electric field, has features of a high response speed suitable for an moving image, low voltage driving, low power consumption driving, and the like. Therefore, the light emitting device utilizing an organic electroluminescence has been attracted as a display including a cell phone, a portable information terminal (PDA), and the like of the next generation.

The light emitting element described above is formed with a layer including a light emitting substance interposed between a pair of electrodes (an anode and a cathode). As emission mechanism thereof, when a voltage is applied between the both electrodes, holes injected from the anode and electrons injected from the cathode are recombined with each other in a luminescent center in a layer including a light emitting substance to form molecular exciton. Then, when the molecular exciton returns to a ground state, the molecular exciton releases energy to emit light. It is to be noted that singlet excitation and triplet excitation are known as an excitation state. It is considered that light emission can be performed through singlet excitation or triplet excitation.

Recently, a driving voltage has been remarkably improved. For example, a composite layer of a metal oxide such as vanadium pentoxide or dirhenium heptaoxide and an organic compound is to be a hole injecting layer; whereby an energy barrier when injecting holes from an anode to an organic compound layer can be reduced (see Patent Document 1: Japanese Patent Application Laid-Open No. 2005-123095).

SUMMARY OF THE INVENTION

Incidentally, a light emitting element including an organic substance can be driven by power consumption potentially lower than liquid crystal; however, it is yet to be required for various improvements, and further low power consumption is desired.

The light emitting element described in Patent Document 1 has a hole transporting layer made only of an organic compound. Although a material used in such a hole transporting layer has conductivity to some extent, resistance thereof can hardly be low.

Thus, it is an object of the present invention to provide a light emitting element and a light emitting device with further low power consumption.

In order to achieve the above object, a means below is implemented in the present invention.

A light emitting element has a pair of electrodes and a plurality of layers interposed between the pair of electrodes. The plurality of layers includes at least a light emitting layer and a composite layer including metal oxide and an organic compound between one of the pair of the electrodes and the light emitting layer.

The composite layer has a structure in which a first region and a second region are alternately stacked. A concentration of metal oxide in the first region is equal to or higher than a concentration of metal oxide in the second region, and the highest concentration of metal oxide in the first region is the same or at most eight times as the lowest concentration of metal oxide in the second region.

Each concentration of metal oxide in the composite layer change periodically in the stacked direction. One cycle of a periodic change is 12 nm or less.

According to one mode of a light emitting element of the present invention, a first electrode, and a first composite layer, a second composite layer, a light emitting layer, an electron transporting layer, and a second electrode which are sequentially stacked over the first electrode, are included; the first composite layer and the second composite layer each include metal oxide and an organic compound; and an average concentration of metal oxide in the first composite layer is higher than an average concentration of metal oxide in the second composite layer.

In accordance with the above invention, each of the first composite layer and the second composite layer has a structure in which a first region and a second region are alternately stacked. A concentration of metal oxide in the first region is equal to or higher than a concentration of metal oxide in the second region, and the highest concentration of metal oxide in the first region is the same or at most eight times as the lowest concentration of metal oxide in the second region.

In accordance with the above invention, each concentration of metal oxide in the first composite layer and the second composite layer change periodically in the stacked direction. One cycle of a periodic change is 12 nm or less.

According to another mode of a light emitting element of the present invention, a first electrode, and a first composite layer, a second composite layer, a third composite layer, a light emitting layer, an electron transporting layer, and a second electrode which are sequentially stacked over the first electrode, are included; the first composite layer, the second composite layer, and the third composite layer each include metal oxide and an organic compound; an average concentration of metal oxide in the first composite layer is higher than an average concentration of metal oxide in the second composite layer; and the average concentration of metal oxide in the second composite layer is higher than an average concentration of metal oxide in the third composite layer.

In accordance with the above invention, each of the first composite layer, the second composite layer, and the third composite layer has a structure in which a first region and a second region are alternately stacked. A concentration of metal oxide in the first region is equal to or higher than a concentration of metal oxide in the second region. The highest concentration of metal oxide in the first region is the same or at most eight times as the lowest concentration of metal oxide in the second region, In according with the above invention, each concentration of metal oxide in the first composite layer, the second composite layer, and the third composite layer change periodically in the stacked direction. One cycle of a periodic change is 12 nm or less.

In accordance with the above invention, an average concentration of metal oxide refers to a concentration of metal oxide in the entire composite layer. The composite layer has a structure in which two regions having different concentrations of metal oxide from each other, in other words, a first region and a second region, are alternately stacked.

According to another mode of a light emitting element of the present invention, a first electrode, and a composite layer, a light emitting layer, an electron transporting layer, and a second electrode, which are sequentially stacked over the first electrode, are included; the composite layer includes metal oxide and an organic compound; and the metal oxide in the composite layer has a concentration gradient from the first electrode to the light emitting layer side.

In accordance with the above invention, the concentration of metal oxide in the composite layer has the lowest concentration in a surface in contact with the light emitting layer.

In accordance with the above invention, the concentration of metal oxide in the composite layer is 0 wt % or more and 3 wt % or less in a surface in contact with the light emitting layer.

In accordance with the above invention, the metal oxide is one or plural kinds of titanium oxide, vanadium oxide, chromium oxide, zirconium oxide, niobium oxide, molybdenum oxide, hafnium oxide, tantalum oxide, tungsten oxide, and rhenium oxide.

In accordance with the above invention, the organic compound has a hole transporting property.

In accordance with the above invention, the organic compound has an arylamine skeleton or a carbazole skeleton.

In accordance with the present invention, it is possible to provide a light emitting element where a hole transporting property is improved, and then, a driving voltage is reduced. In addition, by manufacturing a light emitting device using the light emitting element, a light emitting device having high reliability, low power consumption, and long lifetime, and an electronic apparatus provided with the light emitting device can be provided.

In particular, by shortening one cycle of periodic change of a concentration of metal oxide in a composite layer in the stacked direction, an element superior in a current characteristic can be manufactured.

BRIEF DESCRIPTION OF DRAWINGS

FIGS. 9A and 9B are views for explaining a light emitting device of the present invention;

DETAILED DESCRIPTION OF THE INVENTION

Figure 1A:
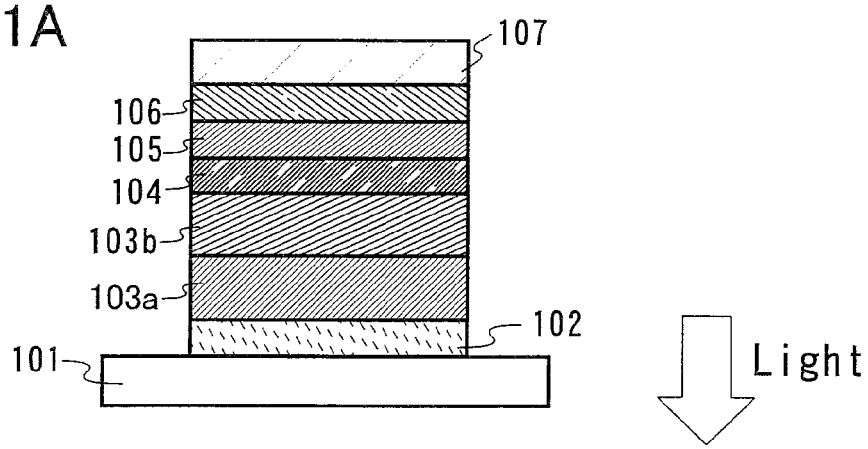
FIGS. 1A to 1C are views for explaining a light emitting element of the present invention.

Embodiment modes of the present invention will be described below with reference to drawings. However, the present invention is not limited to the following description, and it is to be easily understood that various changes and modifications will be apparent to those skilled in the art, unless such changes and modifications depart from the content and the scope of the invention. Therefore, the present invention is not construed as being limited to the description of the following embodiment modes. It is to be noted that the same portion may be denoted by the same reference numeral in differing drawings in a structure of the present invention described below.

Embodiment Mode 1

Figure 1B:
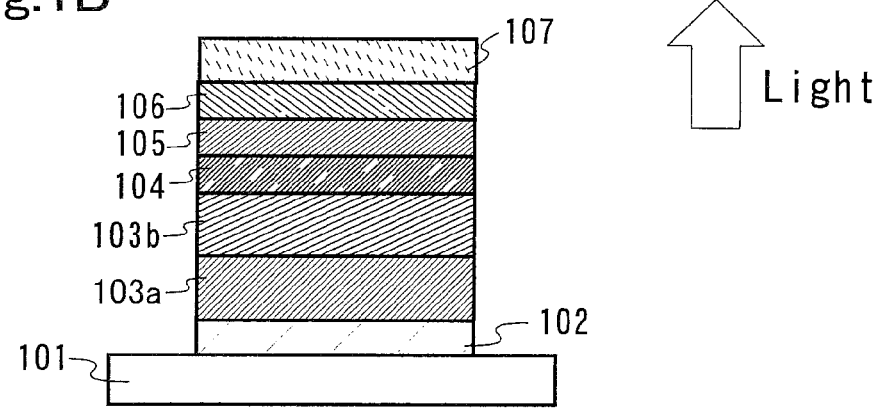
Figure 1C:
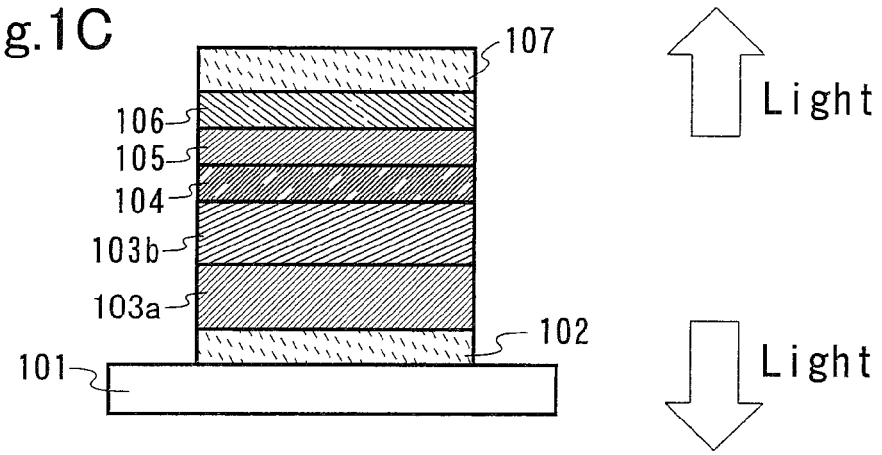

A mode of a light emitting element of the present invention will be explained with reference to FIGS. 1A to 1C. In this mode, a light emitting element is constituted by a first electrode 102; a first composite layer 103a, a second composite layer 103b, a light emitting layer 104, an electron transporting layer 105, and an electron injecting layer 106, which are sequentially stacked over the first electrode 102; and a second electrode 107 formed thereover. It is to be noted that the present embodiment mode is explained, in which the light emitting element is formed over a substrate 101, and the first electrode 102 and the second electrode 107 respectively serve as an anode and a cathode.

As a material used for the substrate 101, for example, a quartz substrate, a glass substrate, a plastic substrate, a flexible substrate, or the like can be used. Other materials may be used as far as they serve as a support in a manufacturing process of the light emitting element.

An anode material for forming the first electrode 102 is not particularly limited, and a metal, an alloy, or an electrically conductive compound each of which has a high work function (work function of 4.0 eV or more), a mixture thereof, or the like is preferable. As a specific example of such anode materials, the following can be used: ITO (indium tin oxide), ITO containing silicon oxide, IZO (indium zinc oxide) formed using a target in which zinc oxide (ZnO) of 2 to 20 wt % is mixed into indium oxide, gold (Au), platinum (Pt), nickel (Ni), tungsten (W), chromium (Cr), molybdenum (Mo), iron (Fe), cobalt (Co), copper (Cu), palladium (Pd), nitride of a metal material such as TiN, and the like.

The first composite layer 103a is a layer including metal oxide and an organic compound. As metal oxide used for the first composite layer 103a, a transition metal oxide is preferable, specifically, titanium oxide, zirconium oxide, hafnium oxide, vanadium oxide, niobium oxide, tantalum oxide, chromium oxide, molybdenum oxide, tungsten oxide, manganese oxide, rhenium oxide, or the like can be used. In particular, vanadium oxide, molybdenum oxide, tungsten oxide, and rhenium oxide are preferable because of a high electron accepting property. Above all, molybdenum oxide is preferable because of stability even under an atmosphere and easiness of treatment.

Further, as an organic compound used for the first composite layer 103a, a material superior in a hole transporting property is preferable. In particular, an organic material having an arylamine skeleton is preferable. For example, a compound of aromatic amines (namely, having a benzene ring-nitrogen bond) such as 4,4'-bis(N-{4-[N,N'-bis(3-methylphenyl)amino]phenyl}-N-phenylamino)biphenyl (abbreviated as DNTPD), 4,4'-bis[N-(4-diphenylaminophenyl)-N-phenylamino]biphenyl (abbreviated as DPAB), N,N'-bis(3-methylphenyl)-N,N'-diphenyl-[1,1'-biphenyl]-4,4'-diamine (abbreviated as TPD), 4,4'-bis[N-(1-naphthyl)-N-phenylamino]biphenyl (abbreviated as a-NPD), 4,4'-bis[N-(9,9-dimethylfluorene-2-yl)-N-phenylamino]biphenyl (abbreviated as DFLDPBi), 4,4'-bis[N-(4-biphenylyl)-N-phenylamino]biphenyl (abbreviated as BBPB), 1,5-bis(diphenylamino)naphthalene (abbreviated as DPAN), 4,4',4"-tris(N,N-diphenylamino)triphenylamine (abbreviated as TDATA), and 4,4',4"-tris[N-(3-methylphenyl)-N-phenylamino]triphenylamine (abbreviated as MTDATA) can be used. Alternatively, an organic material having a carbazole skeleton is preferably used. For example, a compound of N-(2-naphthyl)carbazole (abbreviated as NCz), 4,4'-di(N-carbazolyl)biphenyl (abbreviated as CBP), 9,10-bis[4-(N-carbazolyl)phenyl]anthracene (abbreviated as BCPA), 3,5-bis[4-(N-carbazolyl)phenyl]biphenyl (abbreviated as BCPBi), or 1,3,5-tris[4-(N-carbazolyl)phenyl]benzene (abbreviated as TCPB) can be used. In addition, aromatic hydrocarbon such as anthracene or 9,10-diphenylanthracene (DPA) or aromatic hydrocarbon containing at least one vinyl skeleton such as 4,4'-bis(2,2-diphenylvinyl)biphenyl (DPVBi) may be used. It is to be noted that other materials may be used as far as they are substances having a higher hole transporting property than an electron transporting property.

The second composite layer 103b is also a layer including metal oxide and an organic compound as the same as the first composite layer 103b. As metal oxide and an organic compound used for the second composite layer 103b, the same material as the above first composite layer 103a can be used. It is to be noted that a concentration of metal oxide in the second composite layer 103b is to be lower than a concentration of metal oxide in the first composite layer 103a. However, as a concentration of metal oxide in the second composite layer 103b, a concentration is needed to be selected, which does not quench light emitted by adjacency of the light emitting layer 104 and the metal oxide or quenches only a small part thereof. It is to be noted that most favorable concentration of metal oxide in the composite layer at a surface in contact with the light emitting layer is more than 0 wt % and 3 wt % or less. However, the concentration of metal oxide is not particularly limited as far as the above condition is fulfilled. A concentration percentage by weight [wt %] can be found by a numerical formula 1.

Concentration of metal oxide[wt %]=(weight of metal oxide)/(weight of composite layer)×100 [Numerical Formula 1]

Further, in order to lower the concentration of metal oxide in the composite layer at a surface in contact with the light emitting layer, a concentration of metal oxide contained in the second composite 103b may have a concentration gradient in a direction of a film thickness. It is to be noted that materials used as an organic compound for the first composite layer 103a and the second composite layer 103b may be the same or different with each other.

The first composite layer 103a and the second composite layer 103b may be formed using the above material by co-evaporation using resistance heating, co-evaporation using resistance heating evaporation and electron beam evaporation (EB evaporation), simultaneous deposition by sputtering and resistance heating, or the like. Further, the first composite layer 103a and the second composite layer 103b may be formed by a wet method such as a sol-gel method.

The light emitting layer 104 is a light emitting layer including a substance having high luminosity. The light emitting layer is not particularly limited. However, a layer serving as a light emitting layer mainly has two types: one is a host-gate type layer in which a light emitting substance is dispersed in a material (host material) having a larger energy gap than that of a substance (light-emitting substance or guest material), which becomes a light emission center; the other is a layer forming a light emitting layer using only a light emitting material. The former layer in which concentration quenching hardly occurs is preferable. As a light emitting substance, 4-dicyanomethylene-2-methyl-6-(1,1,7,7-tetramethyljulolidyl-9-enyl)-4H-pyran (abbreviated as DCJT), 4-dicyanomethylene-2-t-butyl-6-(1,1,7,7-tetramethyljulolidyl-9-enyl)-4H-pyran, periflanthene, 2,5-dicyano-1,4-bis(10-methoxy-1,1,7,7-tetramethyljulolidyl-9-enyl)benzene, N,N-dimethylquinacridone (abbreviated as DMQd), coumarin 6, coumarin 545T, tris(8-quinolinolato)aluminum (abbreviated as Alq$_3$), 9,9-bianthryl, 9,10-diphenylanthracene (abbreviated as DPA), 9,10-bis(2-naphthyl)anthracene (abbreviated as: DNA), 2,5,8,11-tetra-t-butylperylene (abbreviated as TBP), or the like can be given. As a host material, an anthracene derivative such as 9,10-di(2-naphthyl)-2-tert-butylanthracene (abbreviation t-BuDNA); a carbazole derivative such as 4,4'-bis(N-carbazolyl)biphenyl (abbreviated as CBP); a metal complex such as tris(4-methyl-8-quinolinolato) aluminum (abbreviated as Almq$_3$), bis(10-hydroxybenzo[h]-quinolinato)beryllium (abbreviated as BeBq$_2$), bis(2-methyl-8-quinolinolato)-4-phenylphenolato-aluminum (abbreviated as BAlq), bis[2-(2-hydroxyphenyl)pyridinato] zinc (abbreviated as Znpp$_2$), and bis[2-(2-hydroxyphenyl)benzoxazolato]zinc (abbreviated as ZnBOX); or the like can be used. As a material for forming a light emitting layer using only a light emitting substance, tris(8-quinolinolato)aluminum (abbreviated as Alq$_3$), 9,10-bis(2-naphthyl)anthracene (abbreviated as DNA), and bis(2-methyl-8-quinolinolato)-4-phenylphenolato-aluminum (abbreviated as BAlq), or the like can be given.

The electron transporting layer 105 is preferably formed using a material that can transport electrons, which is injected into a layer containing a light emitting substance from an electrode serving as a cathode side, toward the light emitting layer. As a specific example of such a material, a metal complex having a quinoline skeleton or a benzoquinoline skeleton such as tris(8-quinolinolato)aluminum (abbreviated as Alq$_3$), tris(8-quinolinolato)gallium (abbreviated as Gaq$_3$), tris(4-methyl-8-quinolinolato)aluminum (abbreviated as Almq$_3$), or bis(10-hydroxybenzo[h]-quinolinato)beryllium (abbreviated as BeBq$_2$) can be given. In addition, a metal complex having an oxazole based or thiazole based ligand, such as bis[2-(2-hydroxyphenyl)-benzoxazolato]zinc (abbreviated as Zn(BOX)$_2$), or bis[2-(2-hydroxyphenyl)-benzothiazolato] zinc (abbreviated as Zn(BTZ)$_2$), or the like can be used as a material for forming the electron transporting layer 105. Further, 2-(4-biphenylyl)-5-(4-tert-buthylphenyl)-1,3,4-oxadiazole (abbreviated as PBD), 1,3-bis[5-(p-tert-buthylphenyl)-1,3,4-oxadiazole-2-yl]benzene (abbreviated as OXD-7), 3-(4-tert-buthylphenyl)-4-phenyl-5-(4-biphenylyl)-1,2,4-triazole (abbreviated as TAZ), 3-(4-tert-buthylphenyl)-4-(4-ethylpheyl)-5-(4-biphenylyl)-1,2,4-triazole (abbreviated as p-EtTAZ), bathophenanthroline (abbreviated as BPhen), bathocuproin (abbreviated as BCP), and an inorganic material such as titanium oxide may be used.

The electron injecting layer 106 is a layer having a function for supporting electron injection from an electrode serving as a cathode into the electron transporting layer 105. The electron injecting layer 106 is not particularly limited, and a layer formed using an alkali metal or alkaline earth metal compound such as lithium fluoride (LiF), cesium fluoride (CsF), or calcium fluoride (CaF2) can be used. Besides, the electron injecting layer 106 may be formed using a mixed layer of any one of the above electron transporting materials and a substance showing an electron donating property with respect to the electron transporting material. As a substance showing an electron donating property, for example, a metal having a low work function can be given. Specifically, an alkaline metal and an alkaline earth metal are preferable, in particular, Li, Mg, and Cs are preferable. Further, an alkaline metal complex such as lithium acetylacetonate (abbreviated as Li(acac)) and 8-quinolinolato-lithium (abbreviated as Liq) can also be effectively used.

As a substance for forming the second electrode 107, a metal, an alloy, or an electrically conductive compound each of which has a low work function (work function of 3.8 eV or less), a mixture thereof, or the like can be used. As a specific example of such cathode materials, the following can be used: an element belonging to Group 1 or 2 in the periodic table, that is, an alkali metal such as lithium (Li) or cesium (Cs) or an alkaline earth metal such as magnesium (Mg), calcium (Ca), or strontium (Sr). In addition, by using a material superior in a function of injecting electrons particularly in the electron injecting layer 106, various conductive materials including the above described materials for the first electrode 102 such as Al, Ag, ITO and ITO containing silicon oxide can be used for the second electrode 107, regardless the level of the work function. Further, without limiting to the electron injecting layer 106, a layer superior in a function of injecting electrons is stacked with the second electrode 107 on the light emitting layer 104 side of the second electrode 107 to obtain the same effect.

It is to be noted that the first electrode 102 and the second electrode 107 are formed by respectively depositing the above anode material and cathode material by an evaporation method, a sputtering method, or the like. Further, the first electrode 102 and the second electrode 107 may be formed using a droplet including a conductor by an inkjet method or the like. As a method for forming the light emitting layer 104, the electron transporting layer 105, and the electron injecting layer 106, in addition to an evaporation method, an inkjet method, a spin coating method, or the like can be used. Different forming methods may be used in each electrode and each layer.

A voltage is applied to a light emitting element of the present invention having the above structure so that potential of the first electrode 102 gets higher than potential of the second electrode 107, whereby the light emitting element can be made to emit light.

Light emission is extracted outside through one or both of the first electrode 102 and the second electrode 107. Accordingly, one or both of the first electrode 102 and the second electrode 107 are manufactured using a light-transmitting substance. In a case where only the first electrode 102 is made of a light-transmitting substance, light emission is extracted from a substrate 101 side through the first electrode 102 as shown in FIG. 1A. In addition, in a case where only the second electrode 107 is made of a light-transmitting substance, light emission is extracted from the opposite side to the substrate 101 through the second electrode 107 as shown in FIG. 1B. In a case where both the first electrode 102 and the second electrode 107 are made of a light-transmitting substance, light emission is extracted from both of the substrate 101 side and the opposite side to the substrate 101 through the first electrode 102 and the second electrode 107 as shown in FIG. 1C.

In the first composite layer 103a and the second composite layer 103b including metal oxide and an organic compound, a driving voltage is not increased even when a film thickness is increased. Therefore, an optical design utilizing a micro cavity effect and an interference effect of light can be performed by adjusting a thickness of the first composite layer 103a and the second composite layer 103b. Thus, a highly quality light emitting element that has superiority in color purity and less color change that depends on a view angle can be manufactured. Further, a film thickness can be selected, which prevents the first electrode 102 and the second electrode 107 from being short-circuited, which is caused by unevenness generated over a surface of the first electrode 102 in forming the electrode and a fine residue remaining over an electrode surface.

Since the first composite layer 103a in contact with the first electrode 102 and the second composite layer 103b have high carrier-density, the first composite layer 103a and the second composite layer 103b have an excellent hole transporting property. Thus, a driving voltage can be reduced. Further, the first electrode 102 and the first composite layer 103a can be made extremely closer to an ohmic contact. Therefore, a range of selection of an electrode material is extended.

The first composite layer 103a and the second composite layer 103b used in the present invention can be formed by vacuum evaporation. Thus, in a case where another layer is formed by vacuum evaporation, any layer can be formed in the same vacuum apparatus. Accordingly, it is possible to manufacture the light emitting element without being exposed to an atmosphere before the light emitting element is completely sealed; therefore, the process becomes easy, and a yield can be improved.

Since the first composite layer 103a and the second composite layer 103b include an organic material and an inorganic material, stress generated between the electrode and the light emitting layer can be relieved.

It is found that, as a concentration of metal oxide contained in the composite layer is higher, a refraction index has a tendency to increase moderately. In the light emitting element of the present invention, a concentration of metal oxide contained in the first composite layer 103a is higher than that of the second composite layer 103b as described above. Therefore, by approximately selecting a concentration of metal oxide, the first composite layer 103a can have a larger refraction index than the second composite layer 103b. Though the first electrode 102 has generally a large refraction index compared to an organic compound used for a light emitting element, by stacking composite layers having different concentrations of metal oxide with each other, each refraction index of the second composite layer 103b, the first composite layer 103a, and the first electrode 102 can be sequentially enlarged.

In accordance with a relation of such a refraction index, in a case where light generated in the light emitting layer 104 is extracted from the first electrode 102 side, namely, in a case where the first electrode 102 is a transparent electrode, a difference of a refraction index in each interface (for example, an interface between the second composite layer 103b and the first composite layer 103a, and an interface between the first composite layer 103a and the first electrode 102) can be reduced. Since reflectivity of light is reduced in an interface of substances, each of which refraction index is further equivalent, light generated in the light emitting layer 104 can be efficiently extracted from the light emitting element. As described above, the efficiency of the extracting light is improved; therefore, a long lifetime light emitting element with low power consumption can be obtained.

Further, by using different organic compounds in the first composite layer 103a and the second composite layer 103b from each other, the first composite layer 103a and the second composite layer 103b, which can obtain the above relation of the refraction index, can be manufactured with a small amount of metal oxide while fulfilling a condition where a concentration of metal oxide in the first composite layer 103a is higher than that of the second composite layer 103b.

In order to extract light efficiently from the light emitting element, an unevenness process may be implemented on a surface of the first electrode 102. In this case, it is preferable that the first composite layer 103a be formed by using a wet method such as a spin coating method to be a film having highly planarity, in consideration of a film stacked thereover.

It is to be noted that another structure other than the above structure may be employed as far as the structure includes the first composite layer 103a, the second composite layer 103b, and the light emitting layer 104. In the present embodiment mode, a structure in which the first electrode 102, the first composite layer 103a, the second composite layer 103b, the light emitting layer 104, the electron transporting layer 105, the electron injecting layer 106, and the second electrode 107 are sequentially stacked over the substrate 101, is provided. However, a structure, in which the first substrate 102 to the second substrate 107 are sequentially stacked over the substrate 101 in reverse order to the above structure, may be employed.

In such a manner, the stacked-layer structure is not particularly limited. A layer made of a substance having a high electron transporting property, a substance having a high electron injecting property, a substance having a high hole injecting property, a bipolar (a substance having a high electron and hole transporting property) substance, or the like may be freely combined with a stacked layer of the light emitting layer, the first composite layer, and the second composite layer to form a stacked structure.

Figure 2:
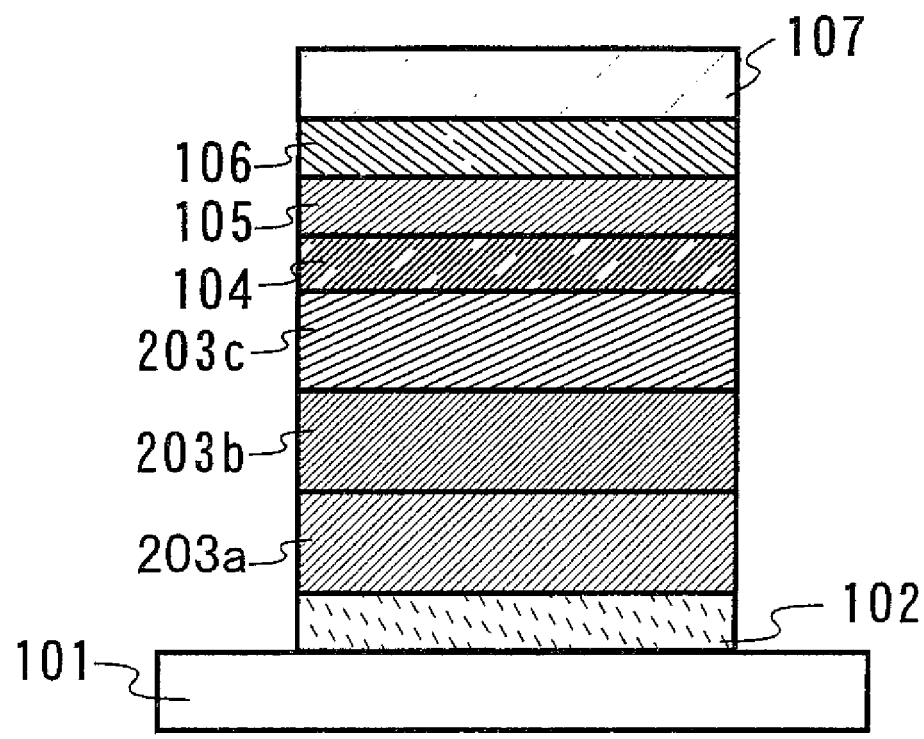
FIG. 2 is a view for explaining a light emitting element of the present invention.

Further, the composite layer is not limited to a two-layer of the first composite layer 103a and the second composite layer 103b, and a composite layer of three-layer of a first composite layer 203a, a second composite layer 203b, and a third composite layer 203c may be employed as shown in FIG. 2. However, each concentration of metal oxide contained in a first electrode 102, the first composite layer 203a, and a second composite layer 203b, and the third composite layer 203c are sequentially lowered.

Furthermore, the composite layer is not limited to a two-layer structure and a three-layer structure. When the number of stacked layers of the composite layer is "n", n>1 may be fulfilled. However, a concentration of metal oxide contained in the composite layers becomes lower from a first electrode 102 to a light emitting layer 104 side. It is to be noted that, as a concentration of metal oxide included in the composite layer in contact with the light emitting layer, a concentration is needed to be selected, which does not quench light emitted by adjacency of the light emitting layer and the metal oxide or quenches only a small part thereof. Further, a composite layer in contact with the light emitting layer may have a concentration gradient from the first electrode toward the light emitting layer side. In Embodiment Mode 2, a case where the number of stacked layers of a composite layer "n" is innumerability, in other words, metal oxide in a composite layer has a concentration gradient, will be shown.

Embodiment Mode 2

Figure 3A:
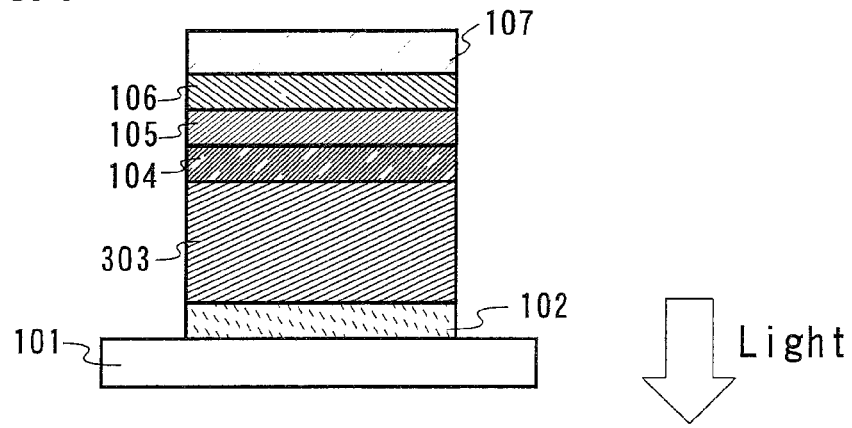
FIGS. 3A to 3C are views for explaining a light emitting element of the present invention.
Figure 3B:
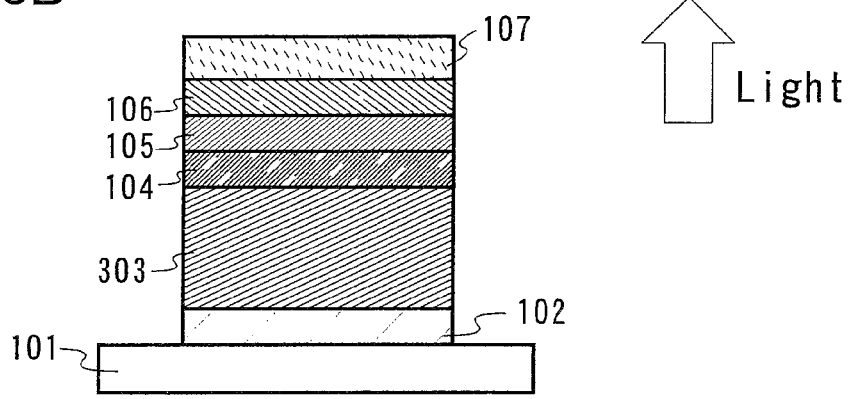
Figure 3C:
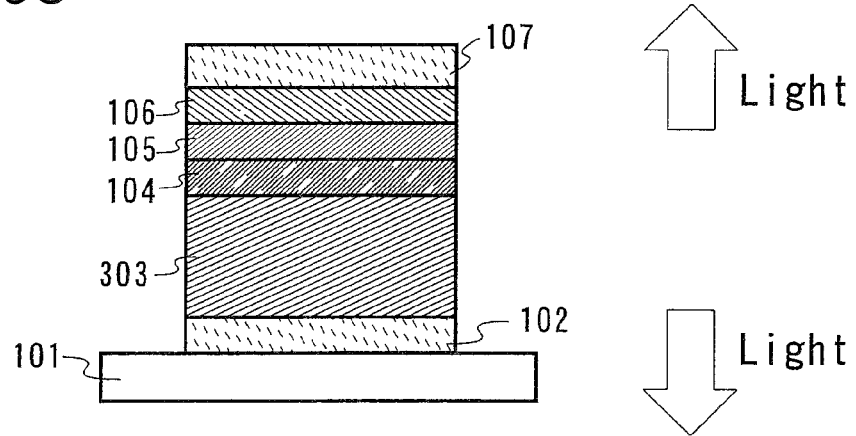

One mode of a light emitting element of the present invention will be explained with reference to FIGS. 3A to 3C. The same portion with Embodiment Mode 1 is denoted by the same reference numeral, and detailed explanation will be omitted.

A light emitting element is formed of a first electrode 102; a composite layer 303, a light emitting layer 104, an electron transporting layer 105, and an electron injecting layer 106, which are sequentially stacked over the first electrode 102; and a second electrode 107 provided thereover. It is to be noted that the present embodiment mode is explained, in which the first electrode 102 and the second electrode 107 respectively serves as an anode and a cathode.

The first electrode 102 is formed over a substrate 101. Further, the composite layer 303 is formed over the first electrode 102. The composite layer 303 is a layer including metal oxide and an organic compound. As metal oxide used for the composite layer 303, a transition metal oxide is preferable, specifically, titanium oxide, zirconium oxide, hafnium oxide, vanadium oxide, niobium oxide, tantalum oxide, chromium oxide, molybdenum oxide, tungsten oxide, manganese oxide, rhenium oxide, or the like can be used. In particular, vanadium oxide, molybdenum oxide, tungsten oxide, or rhenium oxide are preferable because of a high electron accepting property. Above all, molybdenum oxide is preferable because of stability even under an atmosphere and easiness of treatment.

Further, as an organic compound used for the composite layer 303, a material superior in a hole transporting property is preferable. In particular, an organic material having an arylamine skeleton is preferable. For example, a compound of aromatic amines (namely, having a benzene ring-nitrogen bond) such as 4,4'-bis(N-{4-[N,N'-bis(3-methylphenyl)amino]phenyl}-N-phenylamino)biphenyl (abbreviated as DNTPD), 4,4'-bis[N-(4-diphenylaminophenyl)-N-phenylamino]biphenyl (abbreviated as DPAB), N,N'-bis(3-methylphenyl)-N,N'-diphenyl-[1,1'-biphenyl]-4,4'-diamine (abbreviated as TPD), 4,4'-bis[N-(1-naphthyl)-N-phenylamino]biphenyl (abbreviated as a-NPD), 4,4'-bis[N-(9,9-dimethylfluorene-2-yl)-N-phenylamino]biphenyl (abbreviated as DFLDPBi), 4,4'-bis[N-(4-biphenylyl)-N-phenylamino]biphenyl (abbreviated as BBPB), 1,5-bis(diphenylamino)naphthalene (abbreviated as DPAN), 4,4',4"-tris(N,N-diphenylamino)triphenylamine (abbreviated as TDATA), and 4,4',4"-tris[N-(3-methylphenyl)-N-phenylamino]triphenylamine (abbreviated as MTDATA) can be used. Alternatively, an organic material having a carbazole skeleton is preferably used. For example, a compound of N-(2-naphthyl)carbazole (abbreviated as NCz), 4,4'-di(N-carbazolyl)biphenyl (abbreviated as CBP), 9,10-bis[4-(N-carbazolyl)phenyl]anthracene (abbreviated as BCPA), 3,5-bis[4-(N-carbazolyl)phenyl]biphenyl (abbreviated as BCPBi), or 1,3,5-tris[4-(N-carbazolyl)phenyl]benzene (abbreviated as TCPB) can be used. It is to be noted that other materials may be used as far as they are substances having a higher hole transporting property than an electron transporting property.

The composite layer 303 formed of the above material has a structure in which a concentration of metal oxide contained in the composite layer is gradually lowered from the first electrode side 102 toward the light emitting layer 104 side. Also, the composite layer 303 is a layer having a concentration gradient in the film thickness direction. It is to be noted that a concentration of metal oxide in the composite layer 303 at a surface in contact with the light emitting layer 104 is preferably more than 0 wt % or more and 3 wt % or less.

The composite layer 303 may be formed using the above material by co-evaporation using resistance heating, co-evaporation using resistance heating evaporation and electron beam evaporation (EB evaporation), simultaneous deposition by sputtering and resistance heating, or the like. However, amount of evaporation of metal oxide is needed to be reduced with time.

Next, the light emitting layer 104, the electron transporting layer 105, the electron injecting layer 106, and the second electrode 107 are formed over the composite layer 303. A material and a manufacturing method of the electrode and each layer are the same as those in Embodiment Mode 1.

A voltage is applied to a light emitting element of the present invention, which has the above structure, so that potential of the first electrode 102 gets higher than potential of the second electrode 107, whereby the light emitting element can be made to emit light.

Light emission is extracted outside through one or both of the first electrode 102 and the second electrode 107. Accordingly, one or both of the first electrode 102 and the second electrode 107 are manufactured using a light-transmitting substance. In a case where only the first electrode 102 is made of a light-transmitting substance, light emission is extracted from a substrate 101 side through the first electrode 102 as shown in FIG. 3A. In addition, in a case where only the second electrode 107 is made of a light-transmitting substance, light emission is extracted from the opposite side to the substrate 101 through the second electrode 107 as shown in FIG. 3B. In a case where both the first electrode 102 and the second electrode 107 are made of a light-transmitting substance, light emission is extracted from both of the substrate 101 side and the opposite side to the substrate 101 through the first electrode 102 and the second electrode 107 as shown in FIG. 3C.

In the composite layer 303 including metal oxide and an organic compound, a driving voltage is not increased even when a film thickness is increased. Therefore, an optical design utilizing a micro cavity effect and an interference effect of light can be performed by adjusting a thickness of the composite layer 303. Thus, a highly quality light emitting element that has superiority in color purity and less color change that depends on a view angle can be manufactured. Further, a film thickness can be selected, which prevents the first electrode 102 and the second electrode 107 from being short-circuited, which is caused by unevenness generated over a surface of the first electrode 102 and a fine residue remaining over an electrode surface.

The composite layer 303 has highly carrier-density, the composite layer 303 has an excellent hole transporting property. Thus, a driving voltage can be reduced. Further, the electrode and the composite layers can be made extremely closer to an ohmic contact. Therefore, a range of selection of an electrode material is extended.

The composite layer 303 used in the present invention can be formed by vacuum evaporation. Thus, in a case where another layer is formed by vacuum evaporation, any layer can be formed in the same vacuum apparatus. Accordingly, it is possible to manufacture a light emitting layer without being exposed in an atmosphere before the light emitting element is completely sealed; therefore, the process becomes easy, and a yield can be improved.

Since the composite layer 303 includes an organic material and an inorganic material, stress generated between the electrode and the light emitting layer can be relieved.

In the present embodiment mode, metal oxide in the composite layer 303 has a concentration gradient, and the concentration becomes lower gradually from the first electrode 102 to the light emitting layer 104 side. Therefore, a refraction index of the composite layer 303 can be continuously changed from the light emitting layer 104 to first electrode 102 side. In addition, a concentration of metal oxide in the composite layer 303 at a surface in contact with the first electrode 102 is appropriately selected so as to be close to a refraction index of the first electrode 102, whereby a difference of a refraction index can be reduced also at an interface between the composite layer 303 and the first electrode 102. Therefore, when light emitted generated in the light emitting layer 104 is extracted from the first electrode 102 side, a difference of a refraction index can be reduced in the composite layer 303 and at an interface between the composite layer 303 and the first electrode 102. Since reflectivity of light is reduced in an interface of substances, each of which refraction index is further equivalent, light generated in the light emitting layer 104 can be efficiently extracted from the light emitting element. As described above, the efficiency of the extracting light is improved; therefore, a light emitting element with a long lifetime and low power consumption can be obtained.

In order to extract light efficiently from the light emitting element, an unevenness process may be implemented on a surface of the first electrode 102. In this case, it is preferable that the composite layer 303 be formed to be a film having highly planarity in consideration of a film stacked thereover.

It is to be noted that another structure other than the above structure may be employed as far as the structure includes the composite layer 303 and the light emitting layer 104. In the present embodiment mode, a structure in which the first electrode 102, the composite layer 303, the light emitting layer 104, the electron transporting layer 105, the electron injecting layer 106, and the second electrode 107 are sequentially stacked over the substrate 101, is provided. However, a structure, in which the first electrode 102 to the second electrode 107 are sequentially stacked over the substrate 101 in reverse order to the above structure, may be employed.

That is, the stacked-layer structure of is not particularly limited. Layers made of a substance having a high electron transporting property, a substance having a high electron injecting property, a substance having a high hole injecting property, a bipolar (a substance having a high electron and hole transporting property) substance, and the like may be freely combined with a stacked-layer of the light emitting layer, the first composite layer, and the second composite layer to form a stacked structure.

The present embodiment mode can be freely combined with the structure of Embodiment Mode 1.

Embodiment Mode 3

An evaporation apparatus used for implementation of the present invention and a method for forming a composite layer with the use of the evaporation apparatus by co-evaporation will be explained with reference to FIG. 4, FIG. 5, FIG. 6, FIG. 7, and FIGS. 8A to 8C.

Figure 4:
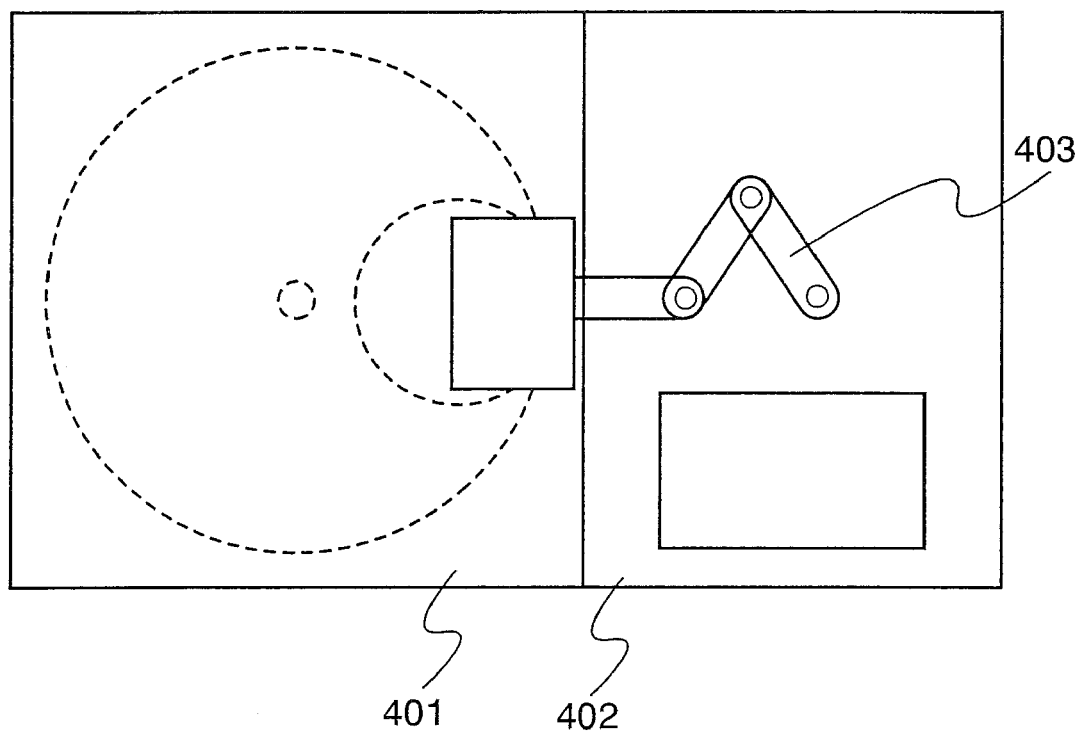
FIG. 4 is a view for explaining a method for manufacturing a light emitting element of the present invention.

In an evaporation apparatus used for implementation of the present invention, a transfer chamber 402 as well as a treatment chamber 401 where evaporation is performed with respect to an object is provided as shown in FIG. 4. The object is transferred to the treatment chamber 401 through the transfer chamber 402. It is to be noted that the transfer chamber 402 is provided with an arm 403 for transferring the object.

Figure 5:
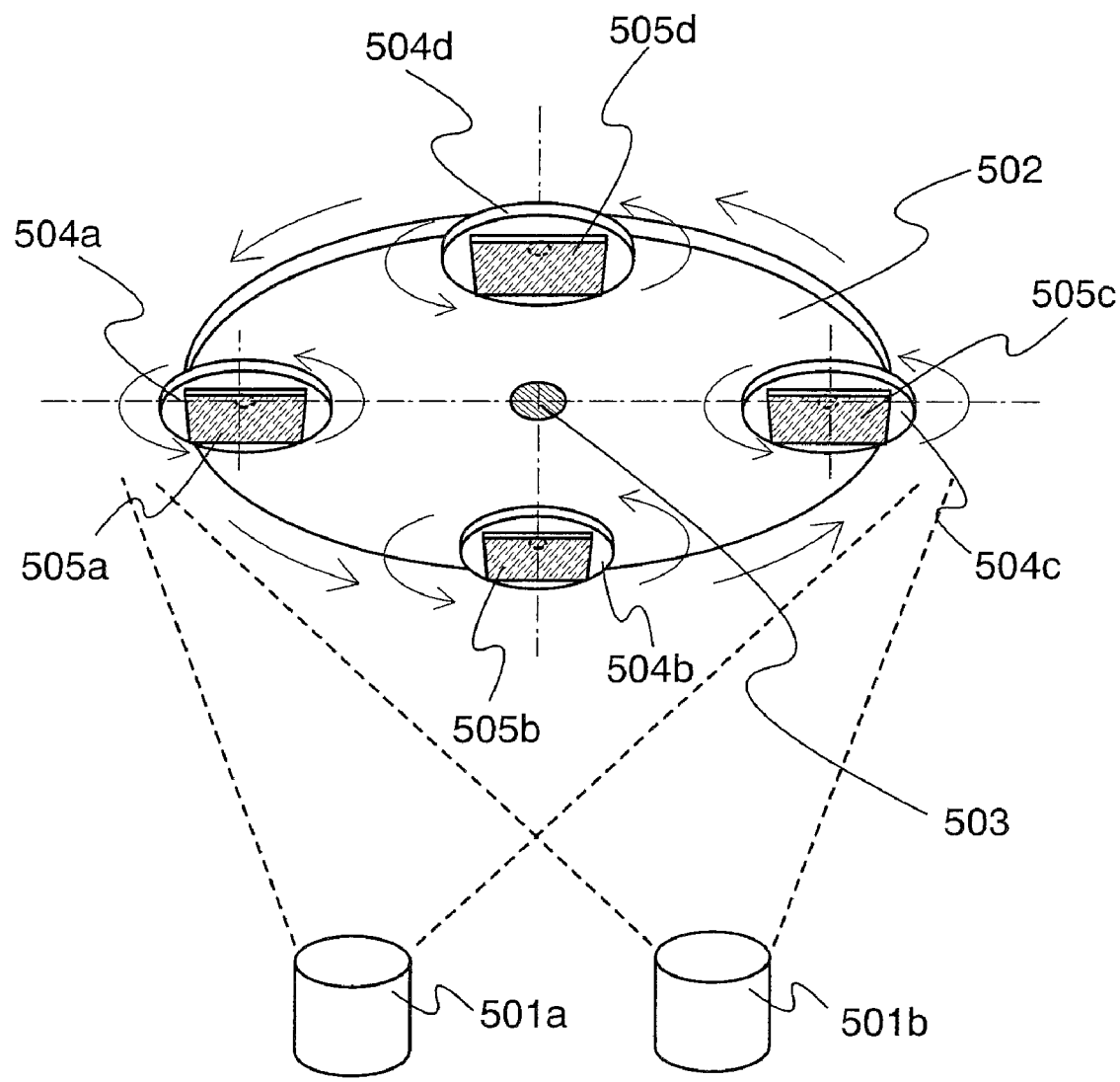
FIG. 5 is a view for explaining a method for manufacturing a light emitting element of the present invention.

In the treatment chamber 401 as shown in FIG. 5, a holder for holding the object, an evaporation source 501a in which metal oxide is held, and an evaporation source 510b in which an organic compound is held are provided. In FIG. 5, the holder for holding the object is constituted by a first rotating plate 502 that is rotated around an axis 503 and a plurality of second rotating plates 504a to 504d provided over the first rotating plate 502. The second rotating plates 504*a* to 504*d* may be independently rotated around each axis that is provided in each of the second rotating plates 504*a* to 504*d*, separately from the axis 503. Objects 505*a* to 505*d* are respectively held over the second rotating plates 504*a* to 504*d*.

In FIG. 5, the object 505*a* is held over the second rotating plate 504*a*, the object 505*b* is held over the second rotating plate 504*b*, the object 505*c* is held over the second rotating plate 504*c*, and the object 505*d* is held over the second rotating plate 504*d*. Though it is not shown here, sliding shutters are provided over each evaporation source.

A composite layer is formed by heating each material held in the evaporation sources 501*a* and 501*b* and evaporating them.

Figure 11:
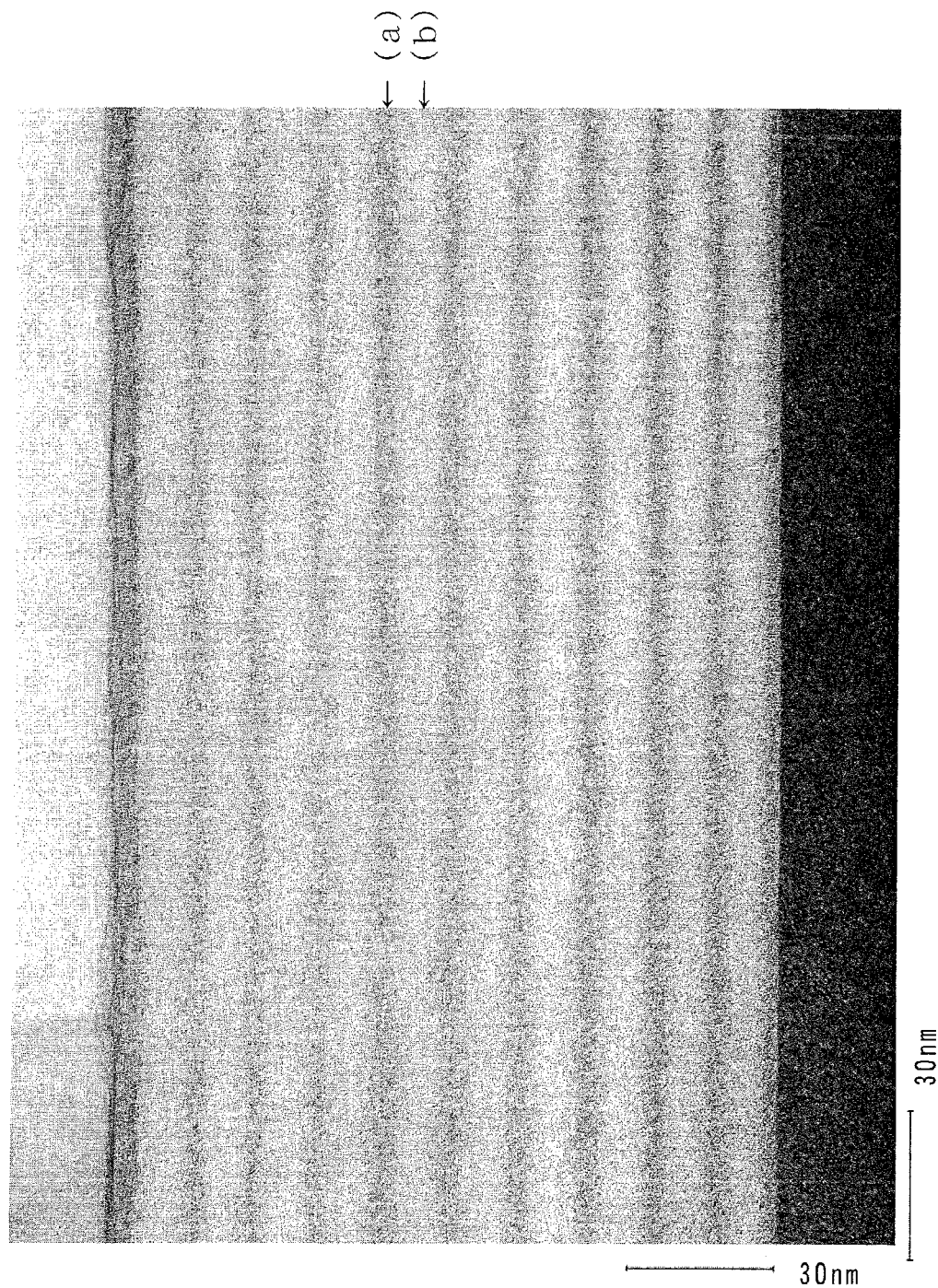
FIG. 11 is a photograph for showing an observation result of a composite layer by a transmission electron microscope.

A composite layer made of molybdenum oxide and DNTPD is formed under a condition where each distance between an upper end of the evaporation sources 501*a* and 501*b* and the objects 505*a* to 505*d* is 270 mm, an evaporation rate of the organic compound is 0.4 nm/s, and the number of rotations of the first rotating plate 502 is 2 rpm. A cross section of the obtained subject 505*a*, in other words, a cross section of the composite layer is observed with the use of a transmission electron microscope (TEM). The obtained TEM photograph is shown in FIG. 11. A weight ratio of the molybdenum oxide and DNTPD in the composite layer is set to be 0.67:1.

From FIG. 11, it can be seen that a first region with a dark color ((a) in FIG. 11) and a second region with a light color ((b) in FIG. 11) are alternately provided. The first region with a dark color is a region where the average atomic weight is high, while the second region with a light color is a region where the average atomic weight is low. Since the average atomic weight of the metal oxide is higher than that of the organic compound in the layer containing a composite material of the present invention, the first region with a dark color in the TEM photograph corresponds to a region containing a larger amount of metal oxide, while the second region with a light color corresponds to a region containing a larger amount of an organic compound. Accordingly, in FIG. 11, the first region with a dark color is a region having a high concentration of molybdenum oxide, and the second region with a light color is a region having a high concentration of DNTPD.

The first region having a high concentration of metal oxide is formed under a condition where a distance between the object 505*a* and the evaporation source 501*a* in which metal oxide is held is shorter than a distance between the object 505*a* and the evaporation source 501*b* in which an organic compound is held. Alternatively, the second region having a low concentration of metal oxide is formed under a condition where a distance between the object 505*a* and the evaporation source 501*b* is shorter than a distance between the object 505*a* and the evaporation source 501*a*. Accordingly, it is found that a concentration of metal oxide in the composite layer has a difference depending on an evaporation position.

Figure 14:
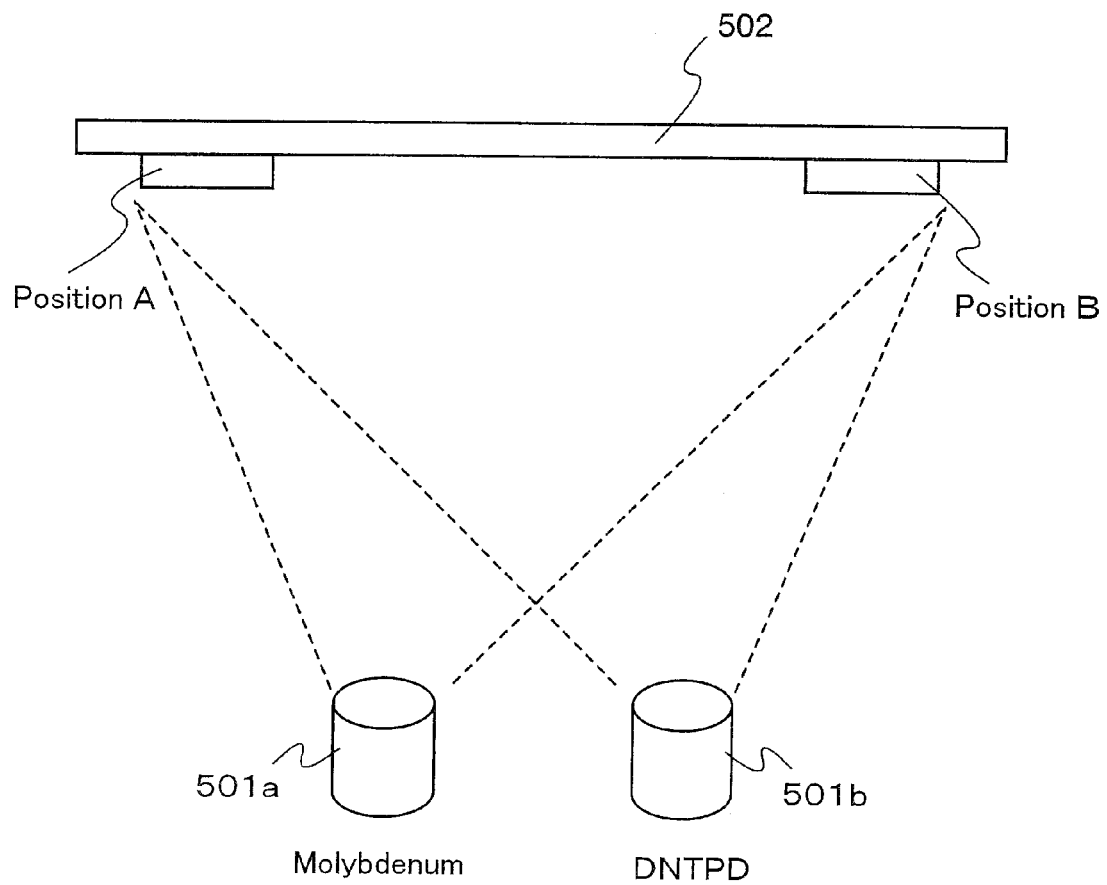
FIG. 14 is a schematic view of an evaporation device in a case of examining a concentration of metal oxide in a composite layer.

Therefore, in order to examine a difference of concentration of metal oxide due to the evaporation position, each concentration of metal oxide in a position A that is closest to the evaporation source 501*a* and a position B that is closest to the evaporation source 501*b* is examined. A schematic view of the evaporation apparatus used for the above examination is shown in FIG. 14.

Molybdenum trioxide for forming molybdenum oxide that is metal oxide, and DNTPD that is an organic compound are respectively held in the evaporation source 501*a* and the evaporation source 501*b*. The metal oxide and the organic compound are each evaporated under the same condition, and then, each concentration of metal oxide in the composite layer, which is to be formed in the positions A and B, is estimated from each film thickness. A result thereof is shown in Table 1.

TABLE 1

| Position | a film [nm] Molybdenum oxide | DNTPD | A concentration of molybdenum oxide in the composite layer [vol %] (calculated value) |
|---|---|---|---|
| A | 65 | 60 | 52.0 |
| B | 15 | 220 | 6.38 |

As shown in Table 1, when only the evaporation source 501*a* is evaporated in the position A, a molybdenum oxide film with a thickness of 65 nm is formed on the object. Alternatively, when only the evaporation source 501*b* is evaporated under the same condition, a DNTPD film with a thickness of 60 nm is formed. Accordingly, in a case where the evaporation sources 501*a* and 501*b* are concurrently evaporated, in other words, co-evaporated, a concentration of molybdenum oxide in the composite layer formed in the position A is calculated to be 52.0 [vol %]. A concentration by volume percent [vol %] display can be found by a numerical formula 2.

Concentration of metal oxide[vol %]=(volume of molybdenum oxide)/(volume of molybdenum oxide+volume of DNTPD)×100   [Numerical Formula 2]

On the other hand, when only the evaporation source 501*a* is evaporated in the position B, a molybdenum oxide film with a thickness of 15 nm is formed on the object. Alternatively, when only the evaporation source 501*b* is evaporated under the same condition, a DNTP film with a thickness of 220 nm is formed. Accordingly, in a case where the evaporation sources 501*a* and 501*b* are evaporated, in other words, co-evaporated, a concentration of molybdenum oxide in the composite layer formed in the position B is calculated to be 6.38 [vol %].

Therefore, the high concentration region of molybdenum oxide is found to have 8.15 times as molybdenum oxide as the low concentration region.

Though the above example is an extreme case, such a phenomenon may be caused in a case where a rotation speed of the first rotating plate 502 is small or in a case where an evaporation rate is extremely high. A composite layer used for a light emitting element is preferably uniform. In the composite layer, a high concentration region of metal oxide is desired to be at least the same or at most eight times as a low concentration region. A rotation speed, an evaporation rate, a distance between the object and the evaporation source, a distance of the evaporation sources, a distance between the second rotating plate and the axis of the first rotating plate, and the like are appropriately designed to perform evaporation so as to fulfill such a condition described above. It is to be noted that the high concentration region of metal oxide in the composite layer corresponds to a region having the highest concentration of metal oxide in the first region, and the low concentration region corresponds to a region having the lowest concentration of metal oxide in the second region.

Further, effect of film thicknesses of the first region and the second region on the composite layer is examined. A composite layer is formed under a condition where the number of rotations of the first rotating plate 502 is increased to 8 rpm compared to the rotation number in the case of manufacturing the composite layer shown in FIG. 11, and other conditions as the same with the above, where an evaporation rate of the organic compound is 0.4 nm/s; and a weight ration of molybdenum oxide and DNTPD is 0.67:1. A cross section of the obtained object 505*a*, in other words, a cross section of the composite layer is observed with the use of a transmission electron microscope (TEM). Further, the obtained TEM photograph is shown in FIG. 12.

Figure 12:
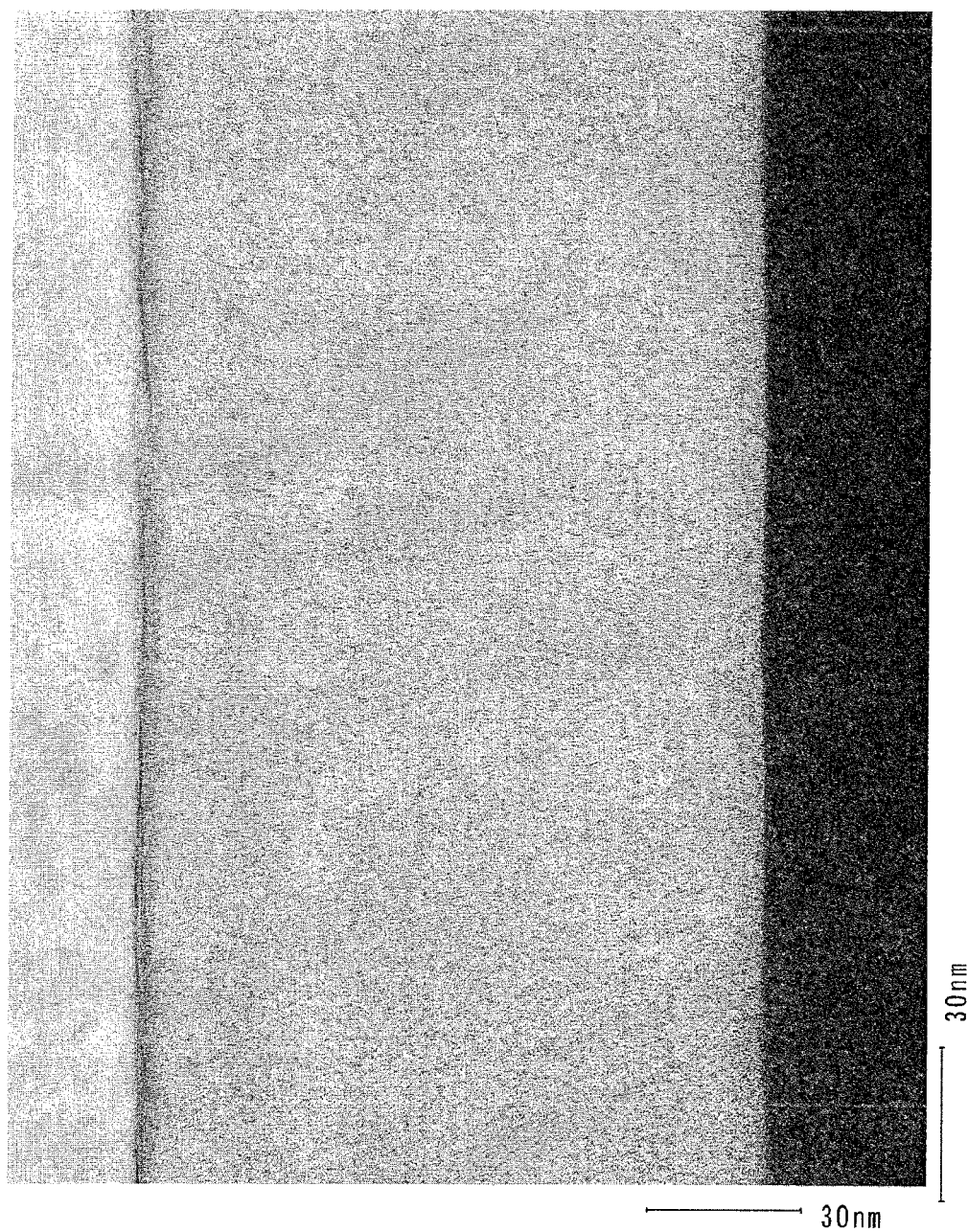
FIG. 12 is a photograph for showing an observation result of a composite layer by a transmission electron microscope.

In FIG. 12, it can also be found that a first region with a dark color and a second region with a light color are alternately provided, similarly to in FIG. 11. As described above, the first region with a dark color is a region having a high concentration of molybdenum oxide, and the second region with a light color is a region having a high concentration of DNTPD.

However, it is found from FIG. 12 that one cycle of a periodic change of the first region and the second region, in other words, one cycle of a periodic change of a concentration of molybdenum oxide is about 3 nm in the composite layer manufactured by increasing the number of rotations of the first rotating plate 502 in the stacked direction, while the one cycle of a periodic change is about 12 nm in FIG. 11.

Characteristics of the composite layers shown in FIG. 11 and FIG. 12 are examined with the use of an element below. The element used for the examination has a structure in which the composite layer shown in FIG. 11 or FIG. 12 is formed to have a thickness of 120 nm after forming ITO containing silicon oxide over the substrate, and aluminum is formed to have a thickness of 300 nm thereover.

It is to be noted that an element having the composite layer (FIG. 11) indicates an element 1, which is obtained in the case where the number of rotations of the first rotating plate 502 is set to be 2 rpm, and the composite layer (FIG. 12) indicates an element 2, which is obtained in the case where the number of rotations of the first rotating plate 502 is set to be 8 rpm.

Figure 13:
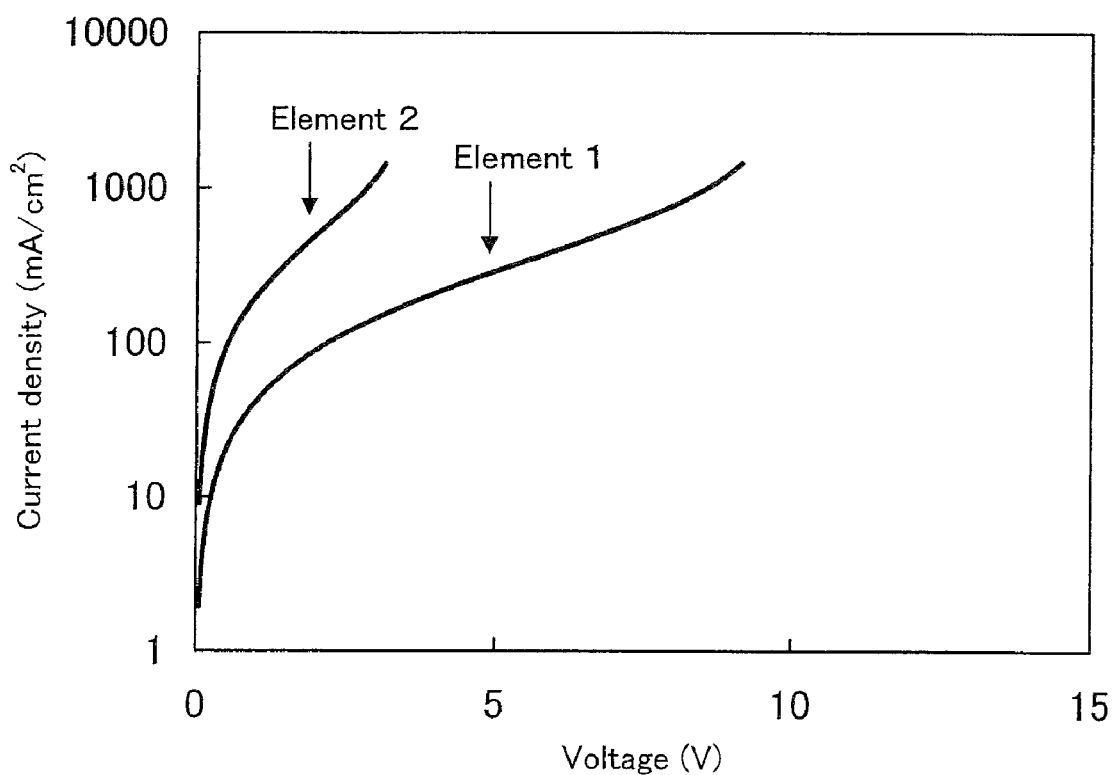
FIG. 13 is a graph for showing a current density-voltage characteristic in a composite layer.

FIG. 13 shows current density-voltage characteristics of the element 1 and the element 2. From FIG. 13, it is found that a current characteristic of the element 2 is superior to a current characteristic of the element 1. Therefore, it is preferable that one cycle of periodic change of a concentration of molybdenum oxide, in other words, a concentration of metal oxide in the composite layer be further shorter. In accordance with the above, one cycle of periodic change of a concentration of metal oxide is preferably 12 nm or less, further preferably, 3 nm or less. Furthermore, a composite layer having a uniform concentration of metal oxide in which one cycle of periodic change is close to 0 nm is preferable. A rotation speed, an evaporation rate, a distance between an object and the evaporation source, a distance of the evaporation sources, a distance between the rotating plate and the axis, and the like are appropriately designed to form a composite layer so as to fulfill such a condition described above.

Figure 6:
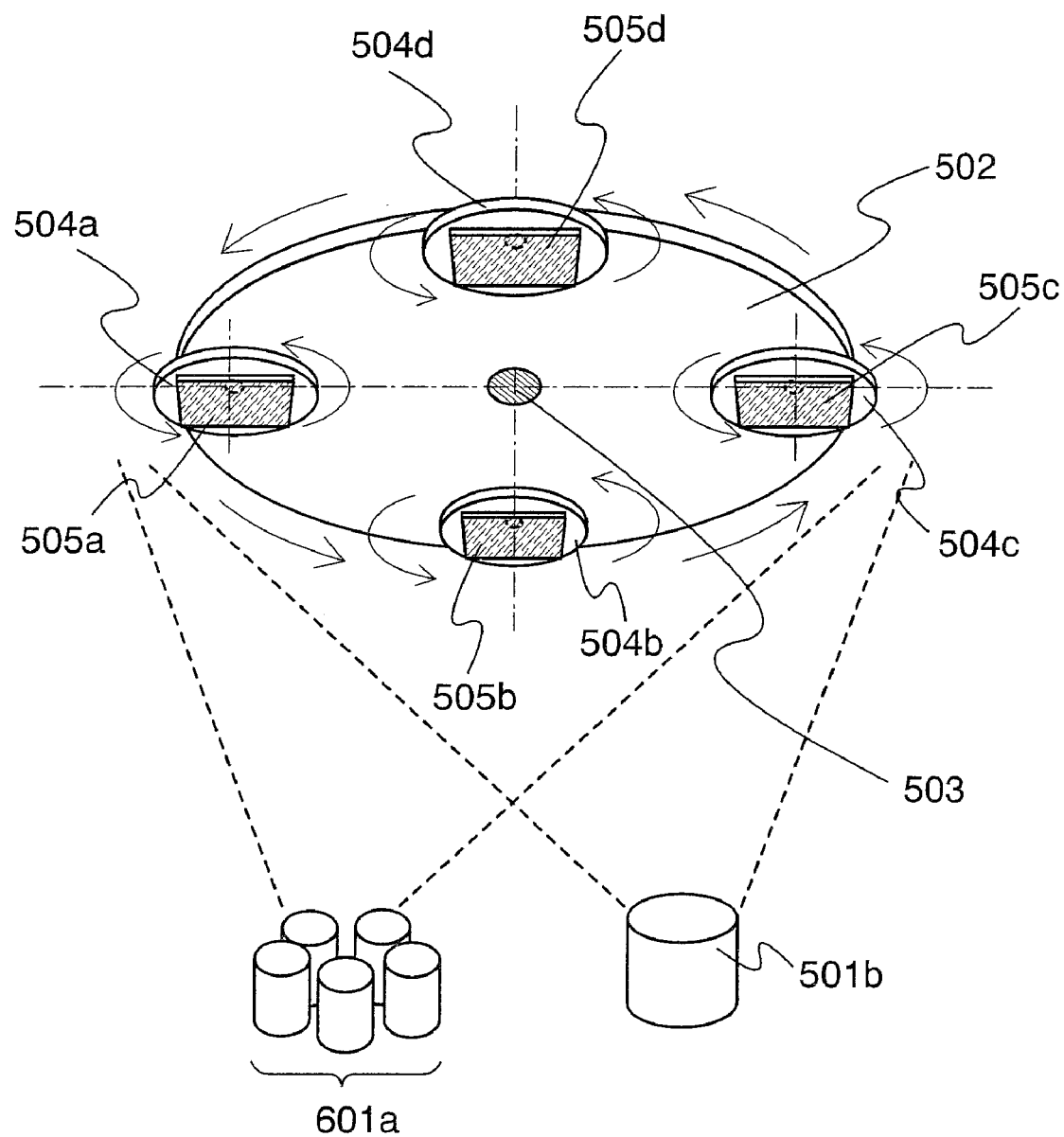
FIG. 6 is a view for explaining a method for manufacturing a light emitting element of the present invention.

Further, a plurality of evaporation sources of metal oxide 601*a* may be set as shown in FIG. 6. Though an example of five evaporation sources is shown in FIG. 6, two, three, four, or six or more of evaporation sources may be provided. In a case of using such an evaporation apparatus, amount of evaporation can be easily controlled by opening and closing shutters provided over each evaporation source. Therefore, a composite layer, which has a stacked-layer of a composite layer having different concentrations of metal oxide and a concentration gradient, can be easily manufactured without decreasing a temperature of an evaporation source.

Evaporation rates of metal oxide and an organic compound may be the same or different between each material, and it is appropriately selected depending on a concentration of metal oxide that is to be formed. Further, shapes of the first rotating plate 502 and the second rotating plates 504*a* to 504*d* are not particularly limited. In addition to a circular form as shown in FIG. 5 and FIG. 6, a polygon such as a quadrangle may be employed. By providing the second rotating plates 504*a* to 504*d*, inside variation of a thickness of a layer or the like formed in an object can be reduced. It is to be noted that the second rotating plates 504*a* to 504*d* are not always needed to be provided.

A structure inside the treatment camber 401 is not limited to the structures shown in FIG. 5 and FIG. 6. For example, a structure in which evaporation sources are shifted as shown in FIG. 7 may be employed.

Figure 7:
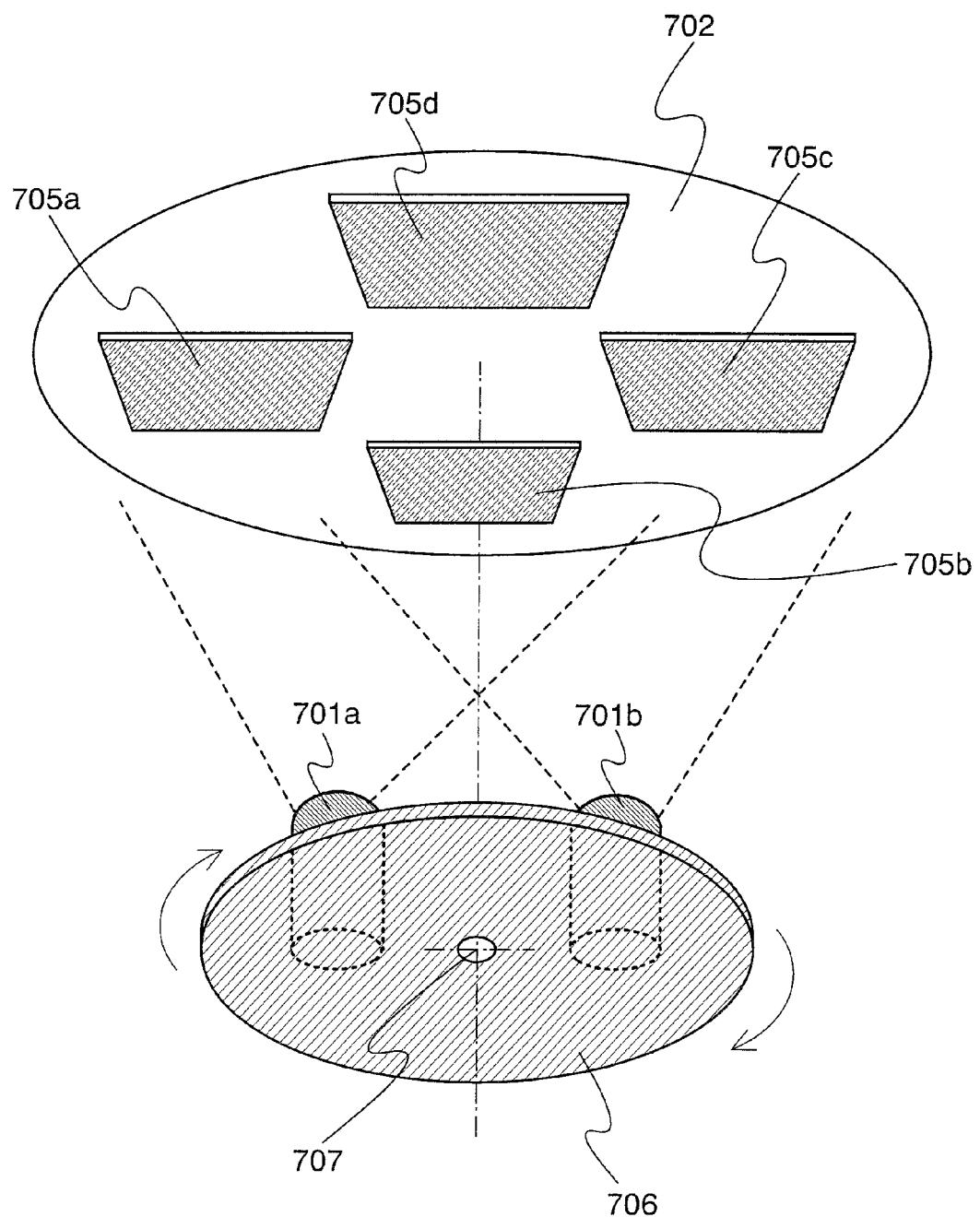
FIG. 7 is a view for explaining a method for manufacturing a light emitting element of the present invention.

In FIG. 7, a rotating plate 706 rotated around an axis 707 and to which evaporation sources 701*a* and 701*b* are fixed, and a holder 702 for holding objects 705*a* to 705*d* are provided as being opposed to each other. Metal oxide and an organic compound are respectively held in the evaporation source 701*a* and the evaporation source 701*b*. When the evaporation source 701*a* is set to be closer to the object 705*a* than the evaporation source 701*b* is, co-evaporation is performed so that a concentration of metal oxide is higher than a concentration of an organic compound over the object 705*a*. When the evaporation source 701*b* is set to be closer to the object 705*a* than the evaporation source 701*a* is by rotating the rotating plate 706, co-evaporation is performed so that a concentration of an organic compound is higher than a concentration of metal oxide over the object 705*a*. In such a manner, an evaporation apparatus may have a structure in which the position of the evaporation source with respect to the object is shifted by shifting the position of the evaporation source. That is, the evaporation source and the object may be provided so that each position is relatively sifted.

Figure 8A:
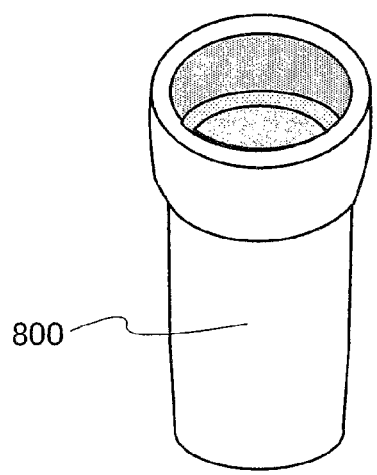
FIGS. 8A to 8C are views for explaining a method for manufacturing a light emitting element of the present invention.

For the evaporation source, there are a resistance heating method that performs direct heating and a radiation heating method that performs indirect heating; however, both methods can be used for manufacturing a composite layer. Any kinds of evaporation containers can be used. For example, a crucible 800 shown in FIG. 8A is an evaporation container that is usually used in a case of mass-production. An evaporation temperature of molybdenum oxide that is used as metal oxide of the composite layer depends on a shape and a size of the crucible. However, since the evaporation temperature of molybdenum oxide is about 450 to 550° C. in vacuums, it is a high evaporation temperature compared to an organic compound. Therefore, a material of the evaporation container is necessary to be considered. For the evaporation container, a non-metal material such as aluminum nitride, boron nitride, silicon carbide, or boron phosphate is preferable. Alternatively, a composite material of these materials may be used. In addition, an arbitrary material such as tantalum, tungsten, or alumina may be appropriately selected in consideration of a working temperature, reactivity, or the like. A thickness of the crucible may be determined by considering expected content and a shape of the evaporation material or thermal conductivity of the material, or the like.

Figure 8B:
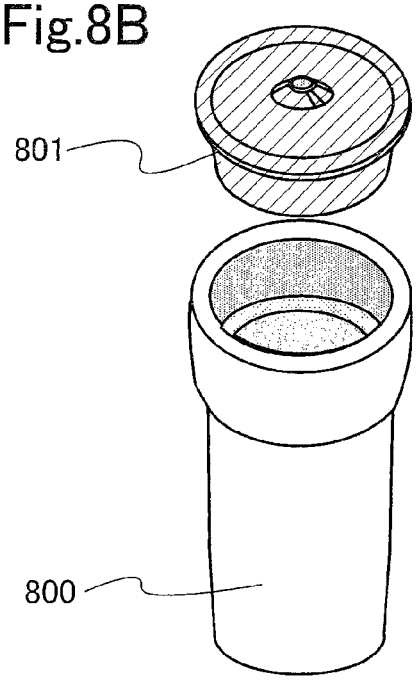

Further, a crucible with a cap 801, which has an opening portion as shown in FIG. 8B may be used. As similar to the crucible 800, a material of the cap 801 may be appropriately selected from one or a plurality of arbitrary materials of aluminum nitride, boron nitride, silicon carbide, boron phosphate, tantalum, tungsten, alumina, or the like in consideration of a working temperature, reactivity, or the like.

As a consideration point in a case of performing evaporation of metal oxide, the opening portion tends to be clogged up with the material. This is because a temperature of an opening portion in an upper side of the evaporation container is lower compared to a temperature in a lower side of the evaporation container. In particular, the opening portion is easily clogged up in a case where an evaporation rate of metal oxide is high.

Figure 8C:
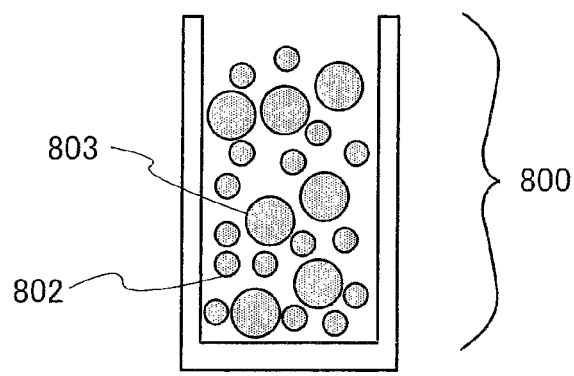

In order to soak an inside of the crucible, means are preferably implemented as the following: number of rolling heaters in the upper side of the crucible is increased; a side surface in the upper side of the crucible is coated with a substance having high thermal conductivity such as silver, gold, copper, aluminum; or a particle 803 having favorable thermal conductivity such as boron nitride (thermal conductivity: 60 $W \cdot m^{-1} \cdot K^{-1}$), silicon carbide (thermal conductivity: 270 $W \cdot m^{-1} \cdot K^{-1}$), aluminum nitride (thermal conductivity: 70 $W \cdot m^{-1} \cdot K^{-1}$ or more and 320 $W \cdot m^{-1} \cdot K^{-1}$ or less), or boron phosphate is put into the crucible 800 with metal oxide 802 that is an evaporation material as shown in FIG. 8C; or the like. Further, these means can be appropriately combined with each other and it is more effective to soaking. Mixture of the particle 803 and the evaporation material has effect that bumping of the evaporation material is prevented. A grain size of the particle 803 is preferably 0.1 mm or more and 5 mm or less in a diameter. For a shape of the particle 803, the particle with a spherical shape is shown here; however, a shape of the particle 803 is not particularly limited. The particle with an ovoid shape, an oval spherical shape like a go stone, an oval spherical shape like a rugby ball, a disc shape, a cylindrical shape, or a polygonal prism shape may be used.

The crucible filled with metal oxide is described here; however, the similar thing to the above is applied to a crucible filled with an organic compound.

It is to be noted that the present embodiment mode can be appropriately combined with Embodiment Mode 1 or Embodiment Mode 2.

Embodiment Mode 4

In the present embodiment mode, a light emitting device having a light emitting element of the present invention will be explained with reference to FIGS. 9A and 9B. FIG. 9A shows a top view showing a light emitting device, and FIG. 9B shows a cross-sectional view of A-A' line in FIG. 9A (a cross-sectional view taken along A-A'). Reference numeral 900 denotes a substrate. Reference numeral 901 shown by a dot line denotes a driver circuit portion (a source side driver circuit). Reference numeral 902 denotes a pixel portion. Reference numeral 903 denotes a driver circuit portion (a gate side driver circuit). Further, reference numeral 904 denotes a sealing substrate, and reference numeral 905 denotes a sealing material. The inside surrounded by the sealing material 905 is a space 906.

Reference numeral 907 denotes a wiring for transmitting signals input to the source side driver circuit 901 and the gate side driver circuit 903, which receives signals such as a video signal, a clock signal, a start signal, and a reset signal from a FPC (Flexible Printed Circuit) 908 that is an external input terminal. Although only the FPC is shown here, a printed wiring board (PWB) may be attached to the FPC. The category of the light emitting device of the present invention includes not only light emitting devices themselves but also light emitting devices to which an FPC or a PWB is attached.

Next, the sectional structure will be explained with reference to FIG. 9B. The driver circuit portion and the pixel portion are formed over the substrate 900. Here, the source side driver circuit 901 that is one of the driver circuit portions and the pixel portion 902 are shown.

In the source side driver circuit 901, a CMOS circuit, in which an n-channel TFT 923 and a p-channel TFT 924 are combined, is formed. The driver circuit constituted by TFTs may be formed with a known CMOS circuit, PMOS circuit, or NMOS circuit. Although the present embodiment mode shows the case that driver circuits are formed over the same substrate, the driver circuits are not necessarily formed over the same substrate, and the driver circuits can be formed outside the substrate.

The pixel portion 902 is constituted by a plurality of pixels, each of which includes a switching TFT 911, a current controlling TFT 912, and a first electrode 913 electrically connected to a drain of the current controlling TFT 912. An insulator 914 is formed to cover an end portion of the first electrode 913. Here, a positive photosensitive acrylic resin film is used to form the insulator 914.

In addition, an upper or lower end portion of the insulator 914 is preferably made to have a curved surface with a curvature in order to form a desirable layer including a light-emitting substance 916 to be formed later. For example, in a case of using positive photosensitive acrylic as a material of the insulator 914, it is preferable that only the upper end portion of the insulator 914 be made to have a curved surface with a curvature radius (0.2 μm to 3 μm). Besides, it is possible to use a negative photosensitive material that is insoluble in an etchant by photosensitive light or a positive photosensitive material that is soluble in an etchant by photosensitive light as the insulator 914. Further, not only organic materials but also inorganic materials can be used as the material of the insulator 914, and for example, silicon oxide, silicon oxynitride or the like can be used.

The layer including a light-emitting substance 916 and a second electrode 917 are formed over the first electrode 913 by the each method shown in the above embodiment modes. When at least a light emitting layer and a composite layer between the light emitting layer and one of the electrodes are provided in the layer including a light-emitting substance 916, other layers are not particularly limited, and any of layers can be appropriately selected.

The sealing substrate 904 and the substrate 900 are bonded to each other with the sealing material 905, and thus, a structure can be obtained, in which a light emitting element 918 is provided in the space 906 surrounded by the substrate 900, the sealing substrate 904, and the sealing material 905. The light emitting element 918 includes the first electrode 913, the layer including a light-emitting substance 916, and the second electrode 917. There is a case that the space 906 is filled with the sealing material 905, in addition to a case that the space 906 is filled with an inert gas (such as nitrogen or argon).

It is to be noted that it is preferable to use an epoxy resin for the sealing material 905. Such a material that hardly transmits moisture and oxygen is preferable. Further, as a material used for the sealing substrate 904, a plastic substrate made of FRP (Fiberglass-Reinforced Plastics), PVF (polyvinyl fluoride), Mylar, polyester, acrylic, or the like can be used as well as a glass substrate or a quartz substrate.

As described above, a light emitting device manufactured by using the present invention can be obtained. The light emitting device has superiority in a hole transporting property because it has a composite layer. Therefore, a driving voltage can be reduced. Further, by selecting a concentration of metal oxide in the composite layer in consideration of a refraction index, reflectivity of light in film interfaces through a light emitting layer, the composite layer, and electrodes can be reduced so that light extraction efficiency can be improved. Accordingly, a light emitting device with low power consumption can be obtained.

The present embodiment mode can be appropriately combined with any structures of Embodiment Modes 1 to 3.

The present invention is not limited to the above embodiment mode.

Embodiment Mode 5

In the present embodiment mode, various electronic apparatuses, which are completed by using a light emitting device having a light emitting element of the present invention, will be explained. By applying the present invention, a light emitting element with a low driving voltage can be provided; therefore, an electronic apparatus equipped with a light emitting element of the present invention can achieve low power consumption.

As electronic apparatuses manufactured by using a light emitting device of the present invention, TV sets, cameras such as video cameras or digital cameras, goggle-type displays (head mounted displays), navigation systems, sound reproduction devices (such as car audios or audio components), personal computers such as laptop computers, game machines, portable information terminals (such as mobile computers, cell phones, portable game machines, or electronic books), image reproduction devices provided with a recording medium (specifically, devices that can reproduce a recording medium such as a digital versatile disk (DVD) and are equipped with a display device capable of displaying the image) and the like can be given. Some specific examples of electronic apparatuses are explained with reference to FIGS. 10A to 10D. Electronic apparatuses using a light emitting device of the present invention is not limited to these specific examples shown here.

Figure 10A:
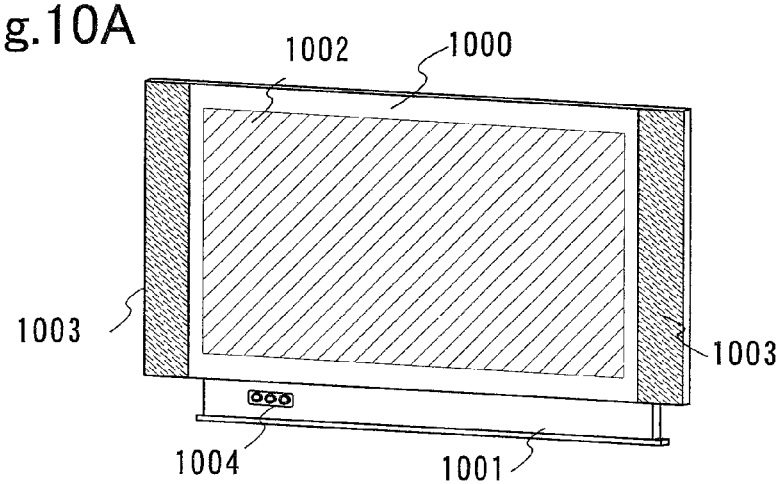
FIGS. 10A to 10D are views for explaining an electronic apparatus using a light emitting element of the present invention.

FIG. 10A shows a display device, which includes a housing 1000, a supporting stand 1001, a display portion 1002, speaker portions 1003, a video input terminal 1004, and the like. The display device is manufactured by using a light emitting device of the present invention for the display portion 1002. It is to be noted that the category of the display device includes all types of information display devices, for example, display devices for a personal computer, display devices for TV broadcast reception, display devices for advertisement display, and the like.

A light emitting element of the present invention is provided in the display portion 1002. The light emitting element of the present invention has superiority in a hole transporting property because it has a composite layer including metal oxide and an organic compound between a first electrode and a light emitting layer. Therefore, a driving voltage can be reduced. Further, by selecting a concentration of metal oxide in the composite layer in consideration of a refraction index, reflectivity of light in film interfaces through a light emitting layer to the first electrode can be reduced so that light extraction efficiency can be improved. Accordingly, a display device with low power consumption can be obtained.

Figure 10B:
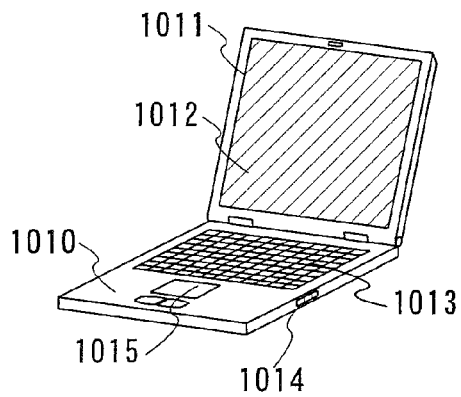

FIG. 10B shows a laptop personal computer, which includes a main body 1010, a housing 1011, a display portion 1012, a keyboard 1013, an external connection port 1014, a pointing mouse 1015, and the like.

A light emitting element of the present invention is provided in the display portion 1012. The light emitting element of the present invention has superiority in a hole transporting property because it has a composite layer including metal oxide and an organic compound between a first electrode and a light emitting layer. Therefore, a driving voltage can be reduced. Further, by selecting a concentration of metal oxide in the composite layer in consideration of a refraction index, reflectivity of light in film interfaces through a light emitting layer to the first electrode can be reduced so that light extraction efficiency can be improved. Accordingly, a personal computer with low power consumption can be obtained.

Figure 10C:
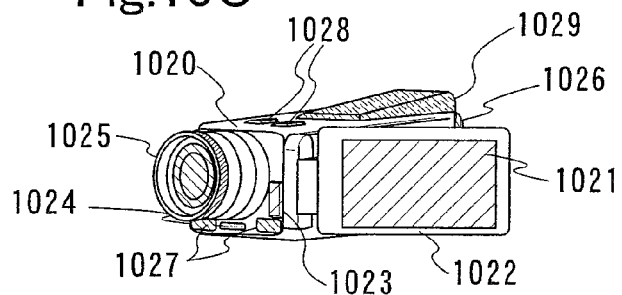

FIG. 10C shows a video camera, which includes a main body 1020, a display portion 1021, a housing 1022, an external connection port 1023, a remote control receiving portion 1024, an image receiving portion 1025, a battery 1026, an audio input portion 1027, operation keys 1028, an eyepiece portion 1029, and the like.

A light emitting element of the present invention is provided in the display portion 1021. The light emitting element of the present invention has superiority in a hole transporting property because it has a composite layer including metal oxide and an organic compound between a first electrode and a light emitting layer. Therefore, a driving voltage can be reduced. Further, by selecting a concentration of metal oxide in the composite layer in consideration of a refraction index, reflectivity of light in film interfaces through a light emitting layer to the first electrode can be reduced so that light extraction efficiency can be improved. Accordingly, a video camera with low power consumption can be obtained.

Figure 10D:
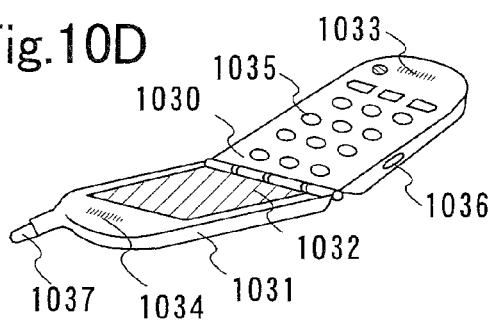

FIG. 10D shows a cell phone, which includes a main body 1030, a housing 1031, a display portion 1032, an audio input portion 1033, an audio output portion 1034, operation keys 1035, an external connection port 1036, an antenna 1037, and the like.

A light emitting element of the present invention is provided in the display portion 1032. The light emitting element of the present invention has superiority in a hole transporting property because it has a composite layer including metal oxide and an organic compound between a first electrode and a light emitting layer. Therefore, a driving voltage can be reduced. Further, by selecting a concentration of metal oxide in the composite layer in consideration of a refraction index, reflectivity of light in film interfaces through a light emitting layer to the first electrode can be reduced so that light extraction efficiency can be improved. Accordingly, a cell phone with low power consumption can be obtained.

As described above, an application range of the present invention is extremely wide, and the present invention can be used in display devices in any fields. Further, the electronic apparatuses of the present embodiment mode can be appropriately combined with any structures of Embodiment Modes 1 to 4.

This application is based on Japanese Patent Application serial no. 2005-191401 filed in Japan Patent Office on Jun. 30, 2005, the entire contents of which are hereby incorporated by reference.

What is claimed is:
1. A light emitting element comprising:
a first electrode;
a first composite layer over the first electrode;
a second composite layer over the first composite layer; and
a second electrode over the second composite layer,
wherein the first composite layer comprises a first metal oxide and a first organic compound, and the second composite layer comprises a second metal oxide and a second organic compound, and
wherein an average concentration of the first metal oxide in the first composite layer is higher than an average concentration of the second metal oxide in the second composite layer.

2. The light emitting element according to claim 1, wherein each of the first metal oxide and the second metal oxide is one or plural kinds of titanium oxide, vanadium oxide, chromium oxide, zirconium oxide, niobium oxide, molybdenum oxide, hafnium oxide, tantalum oxide, tungsten oxide, and rhenium oxide.

3. The light emitting element according to claim 1, wherein each of the first organic compound and the second organic compound has a hole transporting property.

4. The light emitting element according to claim 1, wherein each of the first organic compound and the second organic compound is selected from an arylamine skeleton, a carbazole skeleton, aromatic hydrocarbon, and aromatic hydrocarbon containing at least one vinyl skeleton.

5. A light emitting device comprising the light emitting element according to claim 1.

6. An electronic apparatus comprising the light emitting device according to claim 5.

7. A light emitting element comprising:
a first electrode;
a first composite layer over the first electrode;
a second composite layer over the first composite layer; and
a second electrode over the second composite layer,
wherein the first composite layer comprises a first metal oxide and a first organic compound, and the second composite layer comprises a second metal oxide and a second organic compound,
wherein an average concentration of the first metal oxide in the first composite layer is higher than an average concentration of the second metal oxide in the second composite layer, and
wherein each of the first composite layer and the second composite layer has a structure in which a first region and a second region are alternately stacked.

8. The light emitting element according to claim 7, wherein a concentration of the first metal oxide in the first region is equal to or higher than a concentration of the first metal oxide in the second region in the first composite layer.

9. The light emitting element according to claim 8, wherein a highest concentration of the first metal oxide in the first region is the same or at most eight times as a lowest concentration of the first metal oxide in the second region in the first composite layer.

10. The light emitting element according to claim 7, wherein a concentration of the second metal oxide in the first region is equal to or higher than a concentration of the second metal oxide in the second region in the second composite layer.

11. The light emitting element according to claim 10, wherein a highest concentration of the second metal oxide in the first region is the same or at most eight times as a lowest concentration of the second metal oxide in the second region in the second composite layer.

12. The light emitting element according to claim 7, wherein a concentration of the first metal oxide in the first region is equal to or higher than a concentration of the first metal oxide in the second region in the first composite layer, and a concentration of the second metal oxide in the first region is equal to or higher than a concentration of the second metal oxide in the second region in the second composite layer.

13. The light emitting element according to claim 12, wherein a highest concentration of the first metal oxide in the first region is the same or at most eight times as a lowest concentration of the first metal oxide in the second region in the first composite layer, and a highest concentration of the second metal oxide in the first region is the same or at most eight times as a lowest concentration of the second metal oxide in the second region in the second composite layer.

14. The light emitting element according to claim 7, wherein each of the first metal oxide and the second metal oxide is one or plural kinds of titanium oxide, vanadium oxide, chromium oxide, zirconium oxide, niobium oxide, molybdenum oxide, hafnium oxide, tantalum oxide, tungsten oxide, and rhenium oxide.

15. The light emitting element according to claim 7, wherein each of the first organic compound and the second organic compound has a hole transporting property.

16. The light emitting element according to claim 7, wherein each of the first organic compound and the second organic compound is selected from an arylamine skeleton, a carbazole skeleton, aromatic hydrocarbon, and aromatic hydrocarbon containing at least one vinyl skeleton.

17. A light emitting device comprising the light emitting element according to claim 13.

18. An electronic apparatus comprising the light emitting device according to claim 17.

19. A light emitting element comprising:
a first electrode;
a first composite layer over the first electrode;
a second composite layer over the first composite layer; and
a second electrode over the second composite layer,
wherein the first composite layer comprises a first metal oxide and a first organic compound, and the second composite layer comprises a second metal oxide and a second organic compound,
wherein an average concentration of the first metal oxide in the first composite layer is higher than an average concentration of the second metal oxide in the second composite layer,
wherein each of the first composite layer and the second composite layer has a structure in which a first region and a second region are alternately stacked, and
wherein each concentration of the first metal oxide in the first composite layer and the second metal oxide in the second composite layer changes periodically in the stacked direction.

20. The light emitting element according to claim 19, wherein one cycle of a periodic change is 12 nm or less.

21. The light emitting element according to claim 19, wherein each of the first metal oxide and the second metal oxide is one or plural kinds of titanium oxide, vanadium oxide, chromium oxide, zirconium oxide, niobium oxide, molybdenum oxide, hafnium oxide, tantalum oxide, tungsten oxide, and rhenium oxide.

22. The light emitting element according to claim 19, wherein each of the first organic compound and the second organic compound has a hole transporting property.

23. The light emitting element according to claim 19, wherein each of the first organic compound and the second organic compound is selected from an arylamine skeleton, a carbazole skeleton, aromatic hydrocarbon, and aromatic hydrocarbon containing at least one vinyl skeleton.

24. A light emitting device comprising the light emitting element according to claim 20.

25. An electronic apparatus comprising the light emitting device according to claim 24.

* * * * *